US012563939B2

(12) United States Patent
Tian et al.

(10) Patent No.: US 12,563,939 B2
(45) Date of Patent: Feb. 24, 2026

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Tian, Beijing (CN); Mengmeng Du, Beijing (CN); Xiangdan Dong, Beijing (CN); Cong Fan, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/027,672

(22) PCT Filed: Mar. 29, 2022

(86) PCT No.: PCT/CN2022/083795
§ 371 (c)(1),
(2) Date: Mar. 22, 2023

(87) PCT Pub. No.: WO2023/184167
PCT Pub. Date: Oct. 5, 2023

(65) Prior Publication Data
US 2024/0298494 A1        Sep. 5, 2024

(51) Int. Cl.
*H10K 59/35*        (2023.01)
*H10K 59/131*        (2023.01)

(52) U.S. Cl.
CPC ......... *H10K 59/353* (2023.02); *H10K 59/131* (2023.02)

(58) Field of Classification Search
CPC ............... H10K 59/353; H10K 59/131; G09G 2300/0426; G09G 2300/0452
See application file for complete search history.

(56) References Cited

U.S. PATENT DOCUMENTS

| | | | |
|---|---|---|---|
| 2006/0097628 A1 | 5/2006 | Suh et al. | |
| 2015/0002955 A1 | 1/2015 | Li et al. | |

(Continued)

FOREIGN PATENT DOCUMENTS

| | | |
|---|---|---|
| CN | 1773591 A | 5/2006 |
| CN | 100520894 C | 7/2009 |

(Continued)

*Primary Examiner* — Xuemei Zheng
(74) *Attorney, Agent, or Firm* — WHDA, LLP

(57) ABSTRACT

The present disclosure provides a display substrate and a display device. The display substrate includes a base substrate, and a plurality of data lines, a plurality of pixel driving circuitries and a plurality of light-emission elements on the base substrate. Each light-emission element includes an anode. The pixel driving circuitries in a same column are electrically coupled to a same data line, the data line is configured to provide a data voltage corresponding to a same color, and the pixel driving circuitries electrically coupled to the same data line correspond to the color. An anode of each light-emission element is electrically coupled to a corresponding pixel driving circuitry, and the pixel driving circuitry is configured to provide a driving signal to the light-emission element electrically coupled to the pixel driving circuitry to drive the light-emission element to emit light in a color corresponding to the pixel driving circuitry.

14 Claims, 12 Drawing Sheets

(56) References Cited

U.S. PATENT DOCUMENTS

| 2018/0269268 A1* | 9/2018 | Cai | H10K 59/353 |
| 2021/0159284 A1* | 5/2021 | Huang | H10K 59/352 |
| 2021/0264854 A1* | 8/2021 | Yamanaka | G09G 3/3225 |
| 2021/0295761 A1* | 9/2021 | Wu | G02F 1/1362 |
| 2021/0350736 A1 | 11/2021 | Wu et al. | |

FOREIGN PATENT DOCUMENTS

| CN | 103926735 A | 7/2014 | | |
| CN | 109427278 A | 3/2019 | | |
| CN | 109427279 A | 3/2019 | | |
| GB | 2546002 A | 7/2017 | | |
| JP | 2005-292566 A | 10/2005 | | |
| WO | WO-2021016956 A1 * | 2/2021 | ....... | G02F 1/134309 |

* cited by examiner

1

DISPLAY SUBSTRATE AND DISPLAY DEVICE

CROSS-REFERENCE TO RELATED APPLICATION

This application is the U.S. national phase of PCT Application No. PCT/CN2022/083795 filed on Mar. 29, 2022, the entire contents of which are hereby incorporated by reference.

TECHNICAL FIELD

The present disclosure relates to the field of display technology, in particular to a display substrate and a display device.

BACKGROUND

With the development of the display technology, an Active Matrix Organic Light-Emitting Diode (AMOLED) display device has been widely used due to its characteristics such as full-screen, narrow bezel, high resolution, being flexible and being foldable.

In a conventional display device, data lines in odd-numbered columns drive red pixels and blue pixels, and data lines in even-numbered columns drive green pixels; or data lines arranged in odd-numbered columns drive green pixels, and data lines arranged in even-numbered columns drive red pixels and blue pixels. Luminous efficiency of the red pixel is different from that of the blue pixel, so a driving voltage applied to the red pixel is different from that applied to the blue pixel. As a result, the driving voltage jumps when the pixels in different colors are driven by a same data line, which will lead to a square-level increase in the power consumption.

SUMMARY

In one aspect, the present disclosure provides in some embodiments a display substrate, including a base substrate, and a plurality of data lines, a plurality of pixel driving circuitries arranged in rows and columns and a plurality of light-emission elements arranged in rows and columns on the base substrate. Each light-emission element includes an anode and corresponds to one color. The pixel driving circuitries in a same column are electrically coupled to a same data line, the data line is configured to provide a data voltage corresponding to a same color, and the pixel driving circuitries electrically coupled to the same data line correspond to the color. An anode of each light-emission element is electrically coupled to a corresponding pixel driving circuitry, and the pixel driving circuitry is configured to provide a driving signal to the light-emission element electrically coupled to the pixel driving circuitry to drive the light-emission element to emit light in a color corresponding to the pixel driving circuitry.

In a possible embodiment of the present disclosure, the anode of the light-emission element is arranged in a same row as the pixel driving circuitry electrically coupled to the light-emission element.

In a possible embodiment of the present disclosure, the pixel driving circuitry is arranged closest to the anode of the corresponding light-emission element and corresponds to a same color.

In a possible embodiment of the present disclosure, the anodes of at least a part of the light-emission elements are electrically coupled to the corresponding pixel driving circuitries through connection lines.

In a possible embodiment of the present disclosure, the display substrate includes a first source/drain metal layer, a second source/drain metal layer and an anode layer laminated one on another in a direction away from the base substrate, the data line is arranged in the first source/drain metal layer, the anode is arranged in the anode layer, and the connection line is arranged in the second source/drain metal layer or the anode layer.

In a possible embodiment of the present disclosure, the pixel driving circuitries in a $(4n-3)^{th}$ column of the display substrate correspond to a first color, and the pixel driving circuitries in a $(4n-1)^{th}$ column of the display substrate correspond to a second color, where m and n are positive integers. The light-emission element in a $(2m-1)^{th}$ row and a $(4n-3)^{th}$ column of the display substrate is a light-emission element in a second color, and the light-emission element in the $(2m-1)^{th}$ row and the $(4n-1)^{th}$ column of the display substrate is a light-emission element in a first color; the light-emission element in a $(2m)^{th}$ row and the $(4n-3)^{th}$ column of the display substrate is a light-emission element in the first color, and the light-emission element in the $(2m)^{th}$ row and the $(4n-1)^{th}$ column of the display substrate is a light-emission element in the second color; the anode of the light-emission element in the $(2m-1)^{th}$ row and the $(4n-3)^{th}$ column of the display substrate is electrically coupled to the pixel driving circuitry in the $(2m-1)^{th}$ row and the $(4n-1)^{th}$ column of the display substrate; and the anode of the light-emission element arranged in the $(2m-1)^{th}$ row and the $(4n-1)^{th}$ column of the display substrate is electrically coupled to the pixel driving circuitry in the $(2m-1)^{th}$ row and the $(4n-3)^{th}$ column of the display substrate.

In a possible embodiment of the present disclosure, the pixel driving circuitries in a $(4n-3)^{th}$ column of the display substrate correspond to a second color, and the pixel driving circuitries in a $(4n-1)^{th}$ column of the display substrate correspond to a first color, where m and n are positive integers; the light-emission element in a $(2m-1)^{th}$ row and the $(4n-3)^{th}$ column of the display substrate is a light-emission element in the second color, and the light-emission element in the $(2m-1)^{th}$ row and the $(4n-1)^{th}$ column of the display substrate is a light-emission element in the first color; the light-emission element in a $(2m)^{th}$ row and the $(4n-3)^{th}$ column of the display substrate is a light-emission element in the first color, and the light-emission element in the $(2m)^{th}$ row and the $(4n-1)^{th}$ column of the display substrate is a light-emission element in the second color; the anode of the light-emission element in the $(2m)^{th}$ row and the $(4n-3)^{th}$ column of the display substrate is electrically coupled to the pixel driving circuitry in the $(2m)^{th}$ row and the $(4n-1)^{th}$ column of the display substrate; and the anode of the light-emission element in the $(2m)^{th}$ row and the $(4n-1)^{th}$ column of the display substrate is electrically coupled to the pixel driving circuitry in the $(2m)^{th}$ row and the $(4n-3)^{th}$ column of the display substrate.

In a possible embodiment of the present disclosure, the pixel driving circuitries in even-numbered columns of the display substrate correspond to a third color, and the light-emission elements in the even-numbered columns of the display substrate are light-emission elements in the third color; and the anode of the light-emission element in an $a^{th}$ row and a $(2b)^{th}$ column of the display substrate is electrically coupled to the pixel driving circuitry in the $a^{th}$ row and the $(2b)^{th}$ column of the display substrate, where a and b are positive integers.

In a possible embodiment of the present disclosure, the pixel driving circuitries in a $(4n-2)^{th}$ column of the display substrate correspond to a first color, and the pixel driving circuitries in a $(4n)^{th}$ column of the display substrate correspond to a second color, where m and n are positive integers; the light-emission element in a $(2m-1)^{th}$ row and the $(4n-2)^{th}$ column of the display substrate is a light-emission element in the second color, and the light-emission element in the $(2m-1)^{th}$ row and the $(4n)^{th}$ column of the display substrate is a light-emission element in the first color; the light-emission element in a $(2m)^{th}$ row and the $(4n-2)^{th}$ column of the display substrate is a light-emission element in the first color, and the light-emission element in the $(2m)^{th}$ row and the $(4n)^{th}$ column of the display substrate is a light-emission element in the second color; the anode of the light-emission element in the $(2m-1)^{th}$ row and the $(4n-2)^{th}$ column of the display substrate is electrically coupled to the pixel driving circuitry in the $(2m-1)^{th}$ row and the $(4n)^{th}$ column of the display substrate; and the anode of the light-emission element in the $(2m-1)^{th}$ row and the $(4n)^{th}$ column of the display substrate is electrically coupled to the pixel driving circuitry in the $(2m-1)^{th}$ row and the $(4n-2)^{th}$ column of the display substrate.

In a possible embodiment of the present disclosure, the pixel driving circuitries in a $(4n-2)^{th}$ column of the display substrate correspond to a second color, and the pixel driving circuitries in a $(4n)^{th}$ column of the display substrate correspond to a first color, where m and n are positive integers; the light-emission element in a $(2m-1)^{th}$ row and the $(4n-2)^{th}$ column of the display substrate is a light-emission element in the second color, and the light-emission element in the $(2m-1)^{th}$ row and the $(4n)^{th}$ column of the display substrate is a light-emission element in the first color; the light-emission element in a $(2m)^{th}$ row and the $(4n-2)^{th}$ column of the display substrate is a light-emission element in the first color, and the light-emission element in the $(2m)^{th}$ row and the $(4n)^{th}$ column of the display substrate is a light-emission element in the second color; the anode of the light-emission element in the $(2m)^{th}$ row and the $(4n-2)^{th}$ column of the display substrate is electrically coupled to the pixel driving circuitry in the $(2m)^{th}$ row and the $(4n)^{th}$ column of the display substrate; and the anode of the light-emission element in the $(2m)^{th}$ row and the $(4n)^{th}$ column of the display substrate is electrically coupled to the pixel driving circuitry in the $(2m)^{th}$ row and the $(4n-2)^{th}$ column of the display substrate.

In a possible embodiment of the present disclosure, the pixel driving circuitries in odd-numbered columns of the display substrate correspond to a third color, and the light-emission elements in the odd-numbered columns of the display substrate are light-emission elements in the third color; and the anode of the light-emission element in an ad row and a $(2b-1)^{th}$ column of the display substrate is electrically coupled to the pixel driving circuitry in the at row and the $(2b-1)^{th}$ column of the display substrate, where a and b are positive integers.

In another aspect, the present disclosure provides in some embodiments a display device including the above-mentioned display substrate.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
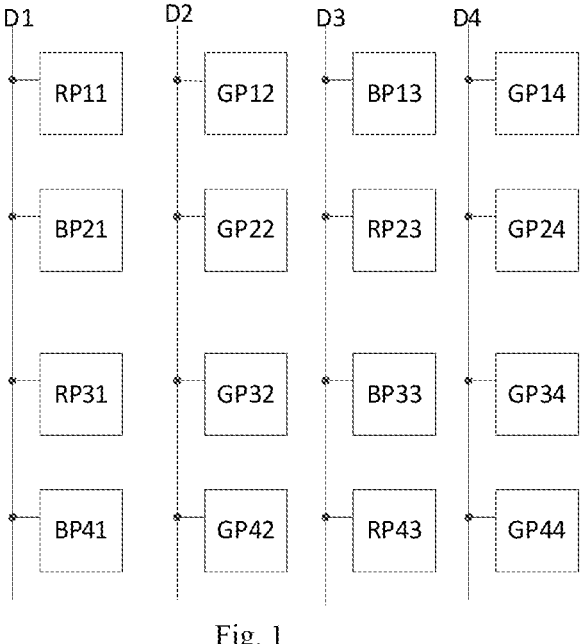
FIG. 1 is a schematic view showing a connection relationship between pixels and data lines in a conventional display device.

FIG. 1 is a schematic view showing at least one connection relationship between pixels and data lines in a conventional display device.

In FIG. 1, RP11 represents a red pixel in a first row and a first column, GP12 represents a green pixel in the first row and a second column, BP13 represents a blue pixel in the first row and a third column, GP14 represents a green pixel in the first row and a fourth column, BP21 represents a blue pixel in a second row and the first column, GP22 represents a green pixel in the second row and the second column, RP23 represents a red pixel in the second row and the third column, GP24 represents a green pixel in the second row and the fourth column, RP31 represents a red pixel in a third row and the first column, GP32 represents a green pixel in the third row and the second column, BP33 represents a blue pixel in the third row and the third column, GP34 represents a green pixel in the third row and the fourth column, BP41 represents a blue pixel in a fourth row and the first column, GP42 represents a green pixel in the fourth row and the second column, RP43 represents a red pixel in the fourth row and the third column, GP44 represents a green pixel in the fourth row and the fourth column, and D1 represents a first data line, D2 represents a second data line, D3 represents a third data line and D4 represents a fourth data line.

As shown in FIG. 1, the pixels in the first column are electrically coupled to the first data line D1, and D1 applies a data voltage to the pixels in the first column; the pixels in the second column are electrically coupled to the second data line D2, and D2 applies a data voltage to the pixels in the second column; the pixels arranged in the third column are electrically coupled to the third data line D3, and D3 applies a data voltage to the pixels in the third column; and the pixels arranged in the fourth column are electrically coupled to the fourth data line D4, and D4 applies a data voltage to the pixels arranged in the fourth column.

Figure 2:
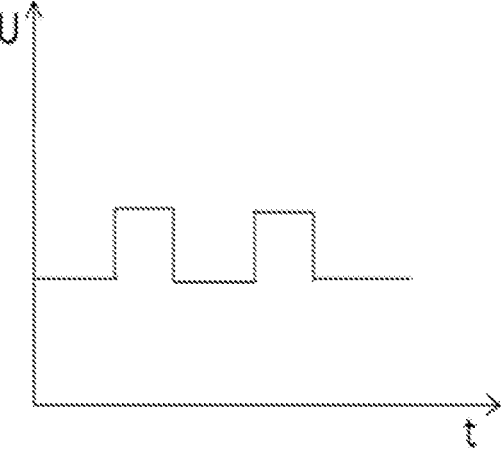
FIG. 2 is a schematic view showing driving voltages on data lines electrically coupled to pixels in different colors in the related art.

D1 is configured to drive the red pixels and the blue pixels, D3 is configured to drive the red pixels and the blue pixels, and the luminous efficiency of the red pixel is different from that of the blue pixel, so a driving voltage applied to the red pixel is different from that applied to the blue pixel. As shown in FIG. 2, the driving voltage jumps when the pixels in different colors are driven by a same data line, which will lead to a square-level increase in power consumption. In FIG. 2, a vertical axis represents the driving voltage U, and a horizontal axis represents time t.

The present disclosure provides in some embodiments a display substrate, which includes a base substrate, and a plurality of data lines, a plurality of pixel driving circuitries arranged in rows and columns and a plurality of light-emission elements arranged in rows and columns on the base substrate. Each light-emission element includes an anode and corresponds to one color. The pixel driving circuitries in a same column are electrically coupled to a same data line, the data line is configured to provide a data voltage corresponding to a same color, and the pixel driving circuitries electrically coupled to the same data line correspond to the same color. An anode of each light-emission element is electrically coupled to a corresponding pixel driving circuitry, and the pixel driving circuitry is configured to provide a driving signal to the light-emission element electrically coupled to the pixel driving circuitry to drive the light-emission element to emit light in a color corresponding to the pixel driving circuitry.

According to the embodiments of the present disclosure, each data line is configured to apply a data voltage to the pixel driving circuitries in a same color, the anode of each light-emission element is electrically coupled to a corresponding pixel driving circuitry, a color corresponding to the light-emission element is the same as a color corresponding to the pixel driving circuitry, the pixel driving circuitry is configured to apply a driving signal to the light-emission element electrically coupled to the pixel driving circuitry so as to drive the light-emission element to emit light in a color corresponding to the pixel driving circuitry. In other words, each data line drives pixel circuitries in a same color (the pixel circuitries include the pixel driving circuitries and the light-emission elements electrically coupled thereto). As a result, it is able to provide a consistent drive voltage, thereby to reduce the power consumption of an integrated circuit (IC).

In the embodiments of the present disclosure, the anode of the light-emission element is arranged in a same row as the pixel driving circuitry electrically coupled to the light-emission element, so as to enable the anode of the light-emission element to be electrically coupled to the pixel driving circuitry conveniently.

In the embodiments of the present disclosure, the pixel driving circuitry is arranged closest to the anode of the corresponding light-emission element and corresponds to a same color, so as to enable the anode of the light-emission element to be electrically coupled to the pixel driving circuitry conveniently.

In the embodiments of the present disclosure, the anodes of at least a part of the light-emission elements are electrically coupled to the corresponding pixel driving circuitries through connection lines, and the connection lines and the anodes are arranged in an anode layer.

In the embodiments of the present disclosure, the connection lines and the anodes are arranged in the anode layer, and each anode is electrically coupled to a first electrode of a data write-in transistor in a corresponding pixel driving circuitry through the connection line.

In the embodiments of the present disclosure, the display substrate includes an active layer, a gate metal layer, a first source/drain metal layer and an anode layer laminated one on another in a direction away from the base substrate, and the connection lines are arranged in the anode layer.

As shown in FIG. 3 to FIG. 9, D1 represents a first data line, D2 represents a second data line, D3 represents a third data line and D4 represents a fourth data line. R11 represents an anode in a first row and a first column, G12 represents an anode in the first row and a second column, B13 represents an anode in the first row and a third column, and G14 represents an anode in the first row and a fourth column; the anode R11 in the first row and the first column is an anode of a red light-emission element, the anode G12 in the first row and the second column is an anode of a green light-emission element, the anode B13 in the first row and the third column is an anode of a blue light-emission element, and the anode G14 in the first row and the fourth column is an anode of a green light-emission element; and the first data line D1 is configured to provide a data voltage to the blue light-emission element, the second data line D2 is configured to provide a data voltage to the green light-emission element, the third data line D3 is configured to provide a data voltage to the red light-emission element, and the fourth data line D4 is configured to provide a data voltage to the green light-emission element.

As shown in FIG. 3 to FIG. 9, R11 is electrically coupled to a pixel driving circuitry in the first row and the third column through a first connection line L1, B13 is electrically coupled to a pixel driving circuitry in the first row and the first column through a second connection line L2, R11 and the first connection line L1 are arranged in the anode layer, B13 and the second connection line L2 are arranged in the anode layer, G12 is electrically coupled to the pixel driving circuitry in the first row and the second column, G14 is electrically coupled to the pixel driving circuitry in the first row and the fourth column, the pixel driving circuitry in the first row and the first column is electrically coupled to the first data line D1, the pixel driving circuitry in the first row and the third column is electrically coupled to the third data line D3, the pixel driving circuitry in the first row and the second column is electrically coupled to the second data line D2, the pixel driving circuitry in the first row and the fourth column is electrically coupled to the fourth data line D4, and the first data line D1, the second data line D2, the third data line D3 and the fourth data line D4 are arranged in the first source/drain metal layer. The pixel driving circuitry in the first row and the third column is configured to receive the data voltage from the third data line D3 and provide a corresponding driving voltage to R11 in accordance with the data voltage; the pixel driving circuitry in the first row and the first column is configured to receive the data voltage from the first data line D1 and provide a corresponding driving voltage to B13 in accordance with the data voltage; the pixel driving circuitry in the first row and the second column is configured to receive the data voltage from the second data line D2 and provide a corresponding driving voltage to G12 in accordance with the data voltage; and the pixel driving circuitry in the first row and the fourth column is configured to receive the data voltage from the fourth data line D4 and provide a corresponding driving voltage to G14 in accordance with the data voltage.

Figure 3:
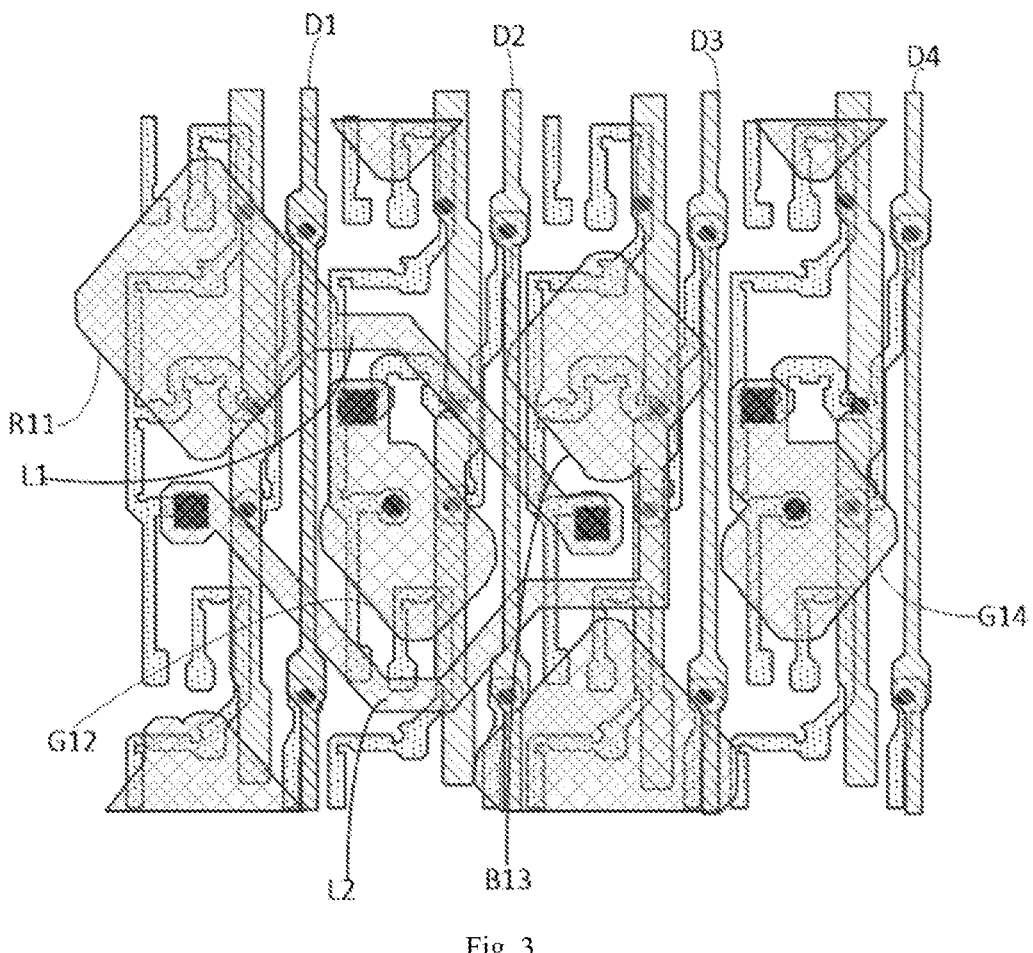
FIG. 3 is a schematic view showing a display substrate where an active layer, a first source/drain metal layer and an anode layer are laminated one on another according to one embodiment of the present disclosure.

As shown in FIG. 3, R11 is electrically coupled to the first connection line L1, the first connection line L1 is electrically coupled to a first conductive connection portion (not shown) arranged in the first source/drain metal layer through a corresponding via hole, and the first conductive connection portion is electrically coupled to a corresponding active layer pattern through a corresponding via hole; B13 is electrically coupled to the second connection line L2, the second connection line L2 is electrically coupled to a second conductive connection portion (not shown) arranged in the first source/drain metal layer through a corresponding via hole, and the second conductive connection portion is electrically coupled to a corresponding active layer pattern through a corresponding via hole; G12 is electrically coupled to a third conductive connection portion (not shown) arranged in the first source/drain metal layer through a corresponding via hole, and the third conductive connection portion is electrically coupled to a corresponding active layer pattern through a corresponding via hole; and G14 is electrically coupled to a fourth conductive connection portion (not shown) arranged in the first source/drain metal layer through a corresponding via hole, and the fourth conductive connection portion is electrically coupled to a corresponding active layer pattern through a corresponding via hole.

Figure 4:
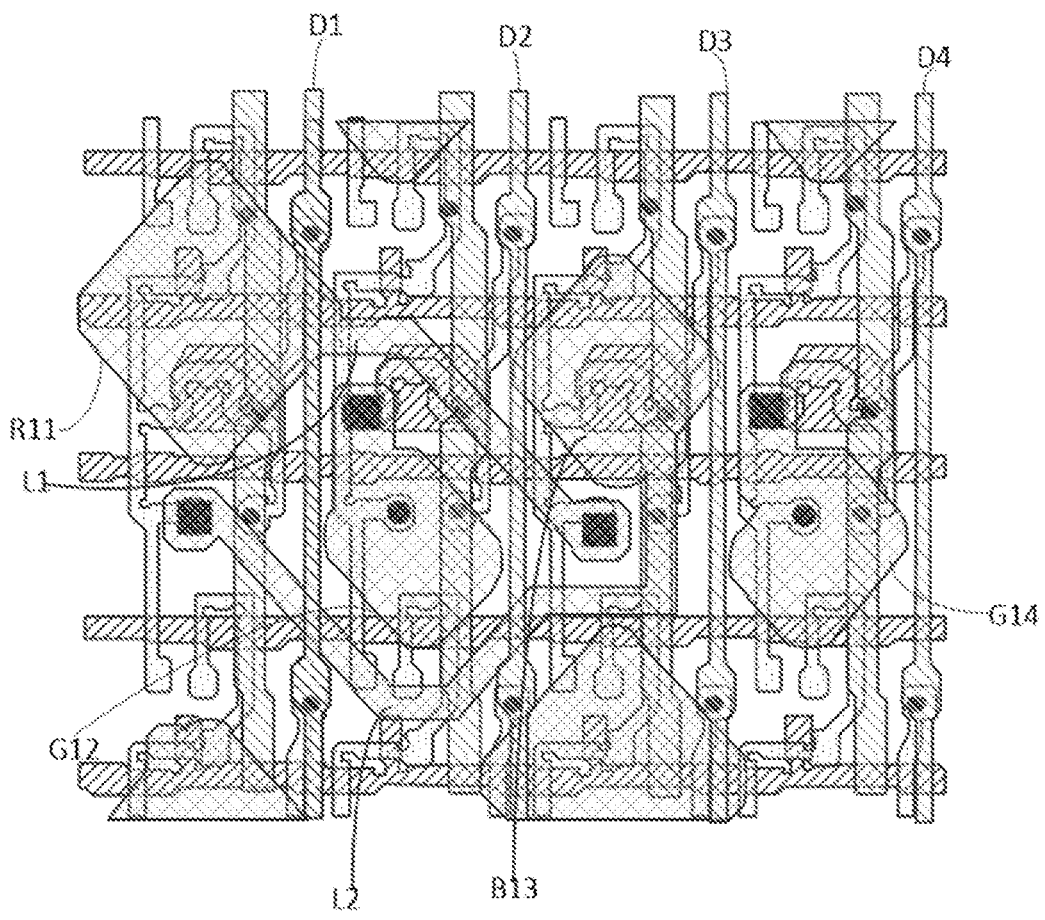
FIG. 4 is a schematic view showing the display substrate in FIG. 3 with a gate metal layer.

In FIG. 3 and FIG. 4, the first conductive connection portion, the second conductive connection portion, the third conductive connection portion and the fourth conductive connection portion in the first source/drain metal layer are omitted, and each of the conductive connection portions is an adapter portion between a conductive pattern in the anode layer and a corresponding active layer pattern.

In FIG. 3 and FIG. 4, black solid circles and black solid boxes represent via holes.

According to the embodiments of the present disclosure, as shown in FIG. 3 to FIG. 9, each data line extends in a zigzag manner to drive the pixels in a same color, so as to provide a consistent driving voltage, thereby to reduce the power consumption.

In FIG. 3 to FIG. 9, between the first source/drain metal layer and the anode layer is provided with, but not limited to, a second source/drain metal layer.

FIG. 3 shows the display substrate where the active layer, the first source/drain metal layer, and the anode layer are laminated one on another.

Figure 5:
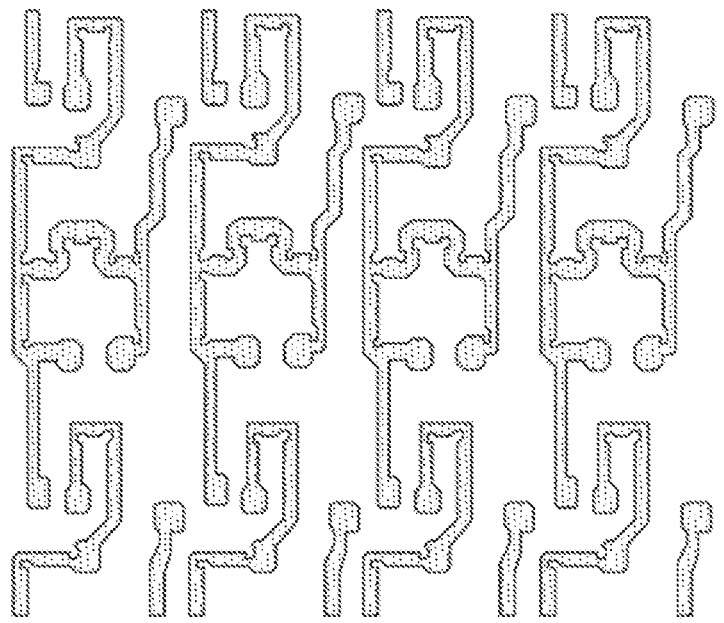
FIG. 5 is a schematic view showing the active layer in FIG. 4.
Figure 6:
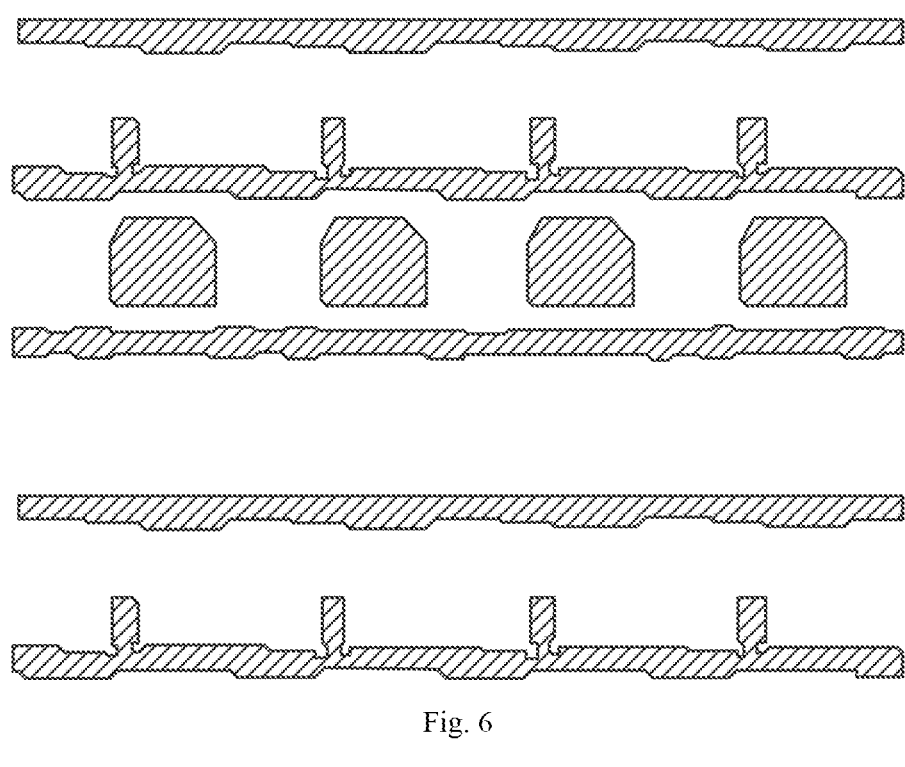
FIG. 6 is a schematic view showing the gate metal layer in FIG. 4.
Figure 7:
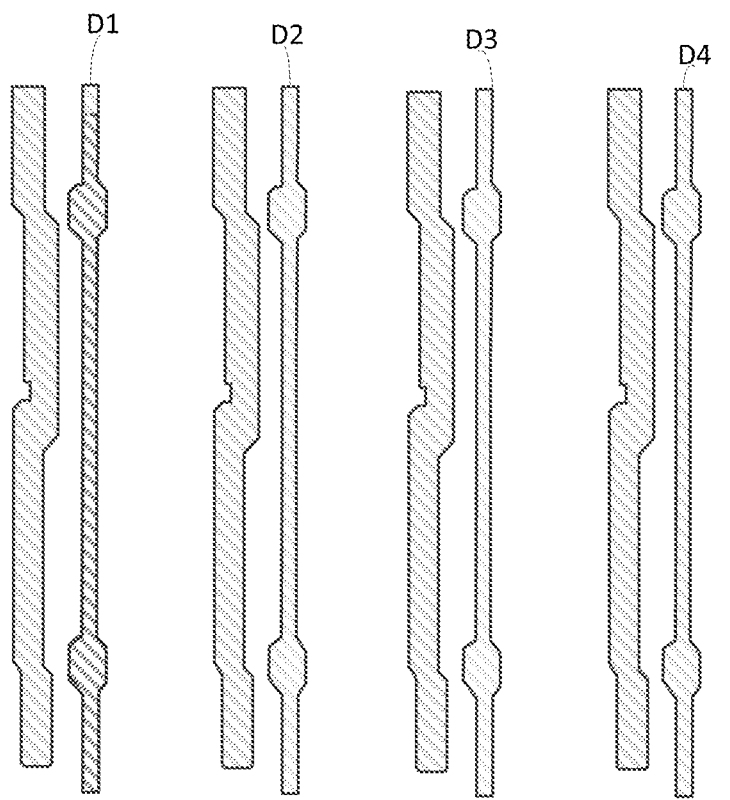
FIG. 7 is a schematic view showing the first source/drain metal layer in FIG. 4.
Figure 8:
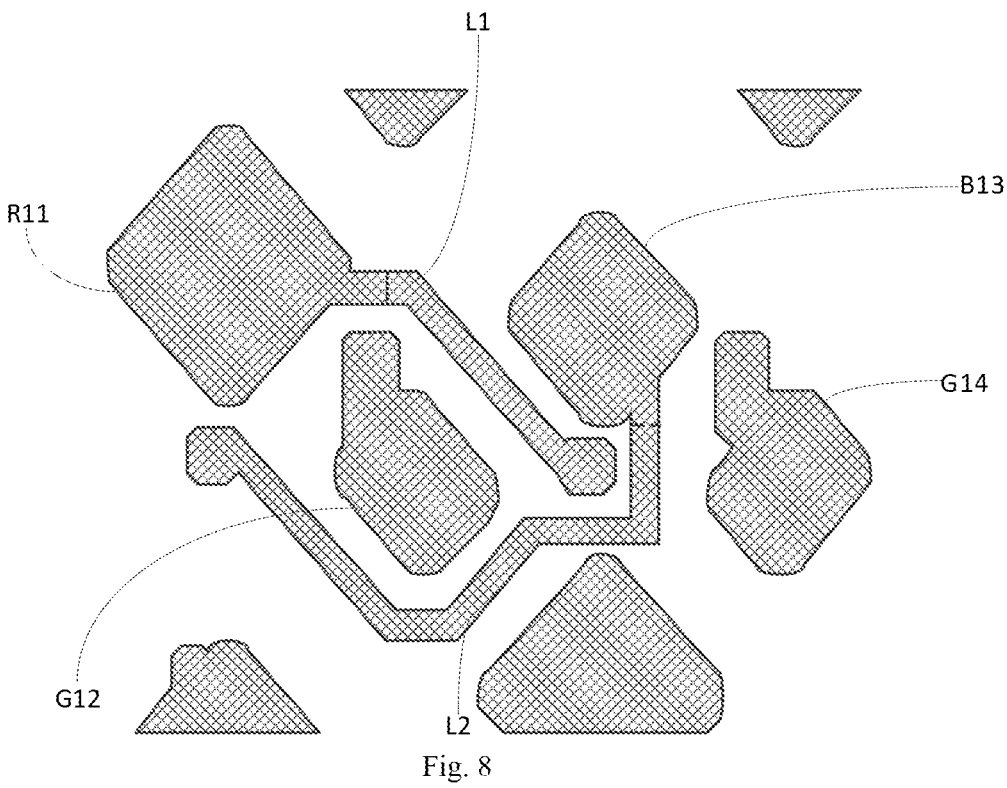
FIG. 8 is a schematic view showing the anode layer in FIG. 4.
Figure 9:
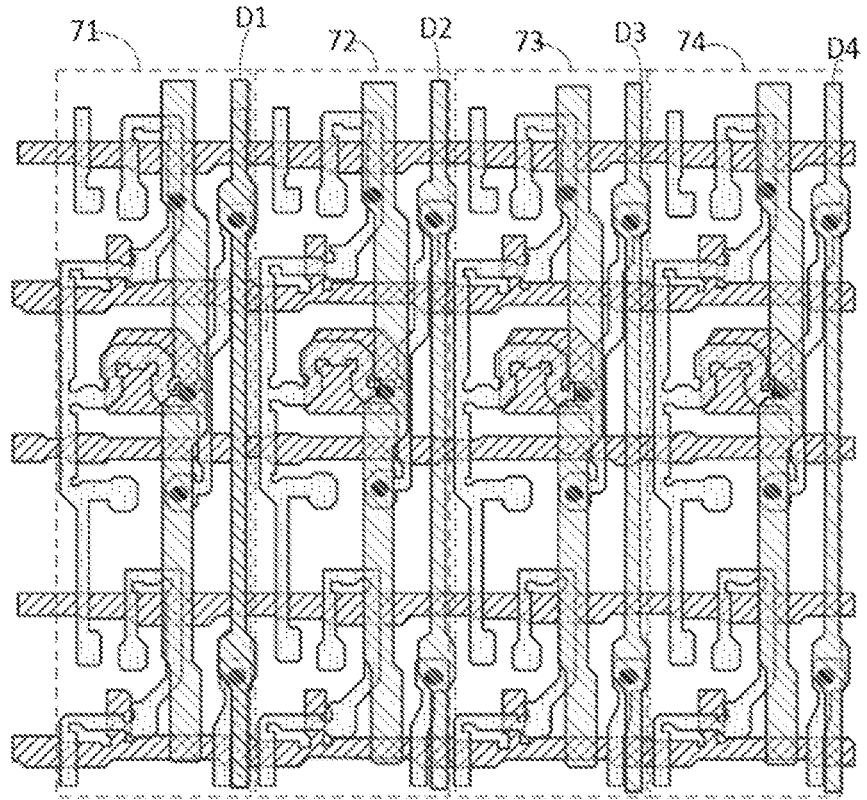
FIG. 9 is a schematic view showing a situation where the active layer, the gate metal layer and the first source/drain metal layer are laminated one on another in FIG. 4.

FIG. 4 shows the display substrate in FIG. 3 with a gate metal layer, FIG. 5 shows the active layer in FIG. 4, FIG. 6 shows the gate metal layer in FIG. 4, FIG. 7 shows the first source/drain metal layer in FIG. 4, FIG. 8 shows the anode layer in FIG. 4, and FIG. 9 shows a situation where the active layer, the gate metal layer and the first source/drain metal layer are laminated one on another in FIG. 4.

In FIG. 9, 71 represents the pixel driving circuitry in the first row and the first column, 72 represents the pixel driving circuitry in the first row and the second column, 73 represents the pixel driving circuitry in the first row and the third column, and 74 represents the pixel driving circuitry in the first row and the fourth column.

In a possible embodiment of the present disclosure, the anodes of at least a part of the light-emission elements are electrically coupled to the corresponding pixel driving circuitries through the connection lines. The display substrate includes a first source/drain metal layer, a second source/drain metal layer and an anode layer laminated one on another in a direction away from the base substrate, the data line is arranged in the first source/drain metal layer, the connection line is arranged in the second source/drain metal layer, and the anode is arranged in the anode layer.

In the embodiments of the present disclosure, the display substrate includes an active layer, a gate metal layer, a first source/drain metal layer, a second source/drain metal layer and an anode layer laminated one on another in a direction away from the base substrate, and the connection lines are arranged in the second source/drain metal layer.

As shown in FIG. 10 to FIG. 17, D1 represents the first data line, D2 represents the second data line, D3 represents the third data line and D4 represents the fourth data line. R11 represents an anode in the first row and the first column, G12 represents an anode in the first row and the second column, B13 represents an anode in the first row and the third column, and G14 represents an anode in the first row and the fourth column; the anode R11 in the first row and the first column is an anode of a red light-emission element, the anode G12 in the first row and the second column is an anode of a green light-emission element, the anode B13 in the first row and the third column is an anode of a blue light-emission element, and the anode G14 in the first row and the fourth column is an anode of a green light-emission element; and the first data line D1 is configured to apply a data voltage to the blue light-emission element, the second data line D2 is configured to apply a data voltage to the green light-emission element, the third data line D3 is configured to apply a data voltage to the red light-emission element, and the fourth data line D4 is configured to apply a data voltage to the green light-emission element.

As shown in FIG. 10 to FIG. 17, R11 is electrically coupled to the pixel driving circuitry in the first row and the third column through a first connection line L1, R11 is arranged in the anode layer, and the first connection line L1 is arranged in the second source/drain metal layer; B13 is electrically coupled to the pixel driving circuitry in the first row and the first column through a second connection line L2, B13 is arranged in the anode layer, and the second connection line L2 is arranged in the second source/drain metal layer; G12 is electrically coupled to the pixel driving circuitry in the first row and the second column, G14 is electrically coupled to a pixel driving circuitry in the first row and the fourth column, and G12 and G14 are arranged in the anode layer; the pixel driving circuitry in the first row and the first column is electrically couple to the first data line D1, and D1 is arranged in the first source/drain metal layer; the pixel driving circuitry in the first row and the third column is electrically couple to the third data line D3, and D3 is arranged in the first source/drain metal layer; the pixel driving circuitry in the first row and the second column is electrically coupled to the second data line D2; the pixel driving circuitry in the first row and the fourth column is electrically coupled to the fourth data line D4, and D2 and D4 are arranged in the first source/drain metal layer; the pixel driving circuitry in the first row and the third column is configured to receive the data voltage from the third data line D3 and provide a corresponding driving voltage to R11 in accordance with the data voltage; the pixel driving circuitry in the first row and the first column is configured to receive the data voltage from the first data line D1 and provide a corresponding driving voltage to B13 in accordance with the data voltage; the pixel driving circuitry in the first row and the second column is configured to receive the data voltage from the second data line D2 and provide a corresponding driving voltage to G12 in accordance with the data voltage; and the pixel driving circuitry in the first row and the fourth column is configured to receive the data voltage from the fourth data line D4 and provide a corresponding driving voltage to G14 in accordance with the data voltage.

Figure 10:
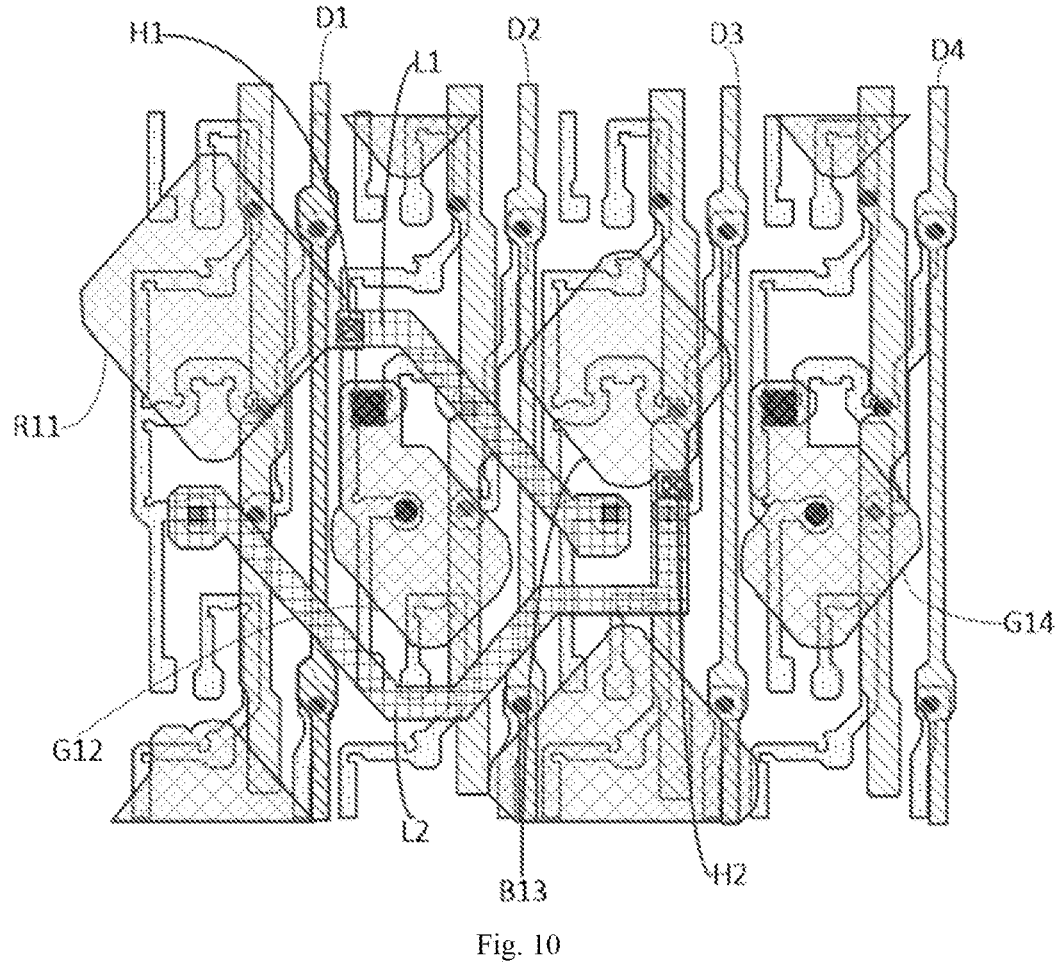
FIG. 10 is a schematic view showing the display substrate where the active layer, the first source/drain metal layer, a second source/drain metal layer and the anode layer are laminated one on another according to one embodiment of the present disclosure.

As shown in FIG. 10, R11 is electrically coupled to the first connection line L1 through a first via hole H1, and B13 is electrically coupled to the second connection line L2 through a second via hole H2; the first connection line L1 is electrically coupled to a first conductive connection portion (not shown) arranged in the first source/drain metal layer through a corresponding via hole, and the first conductive connection portion is electrically coupled to a corresponding active layer pattern through a corresponding via hole; the second connection line L2 is electrically coupled to a second conductive connection portion (not shown) arranged in the first source/drain metal layer through a corresponding via hole, and the second conductive connection portion is electrically coupled to a corresponding active layer pattern through a corresponding via hole; G12 is electrically coupled to a third conductive connection portion (not shown) arranged in the first source/drain metal layer through a corresponding via hole, and the third conductive connection portion is electrically coupled to a corresponding active layer pattern through a corresponding via hole; and G14 is electrically coupled to a fourth conductive connection portion (not shown) arranged in the first source/drain metal layer through a corresponding via hole, and the fourth conductive connection portion is electrically coupled to a corresponding active layer pattern through a corresponding via hole.

Figures 11, 12:
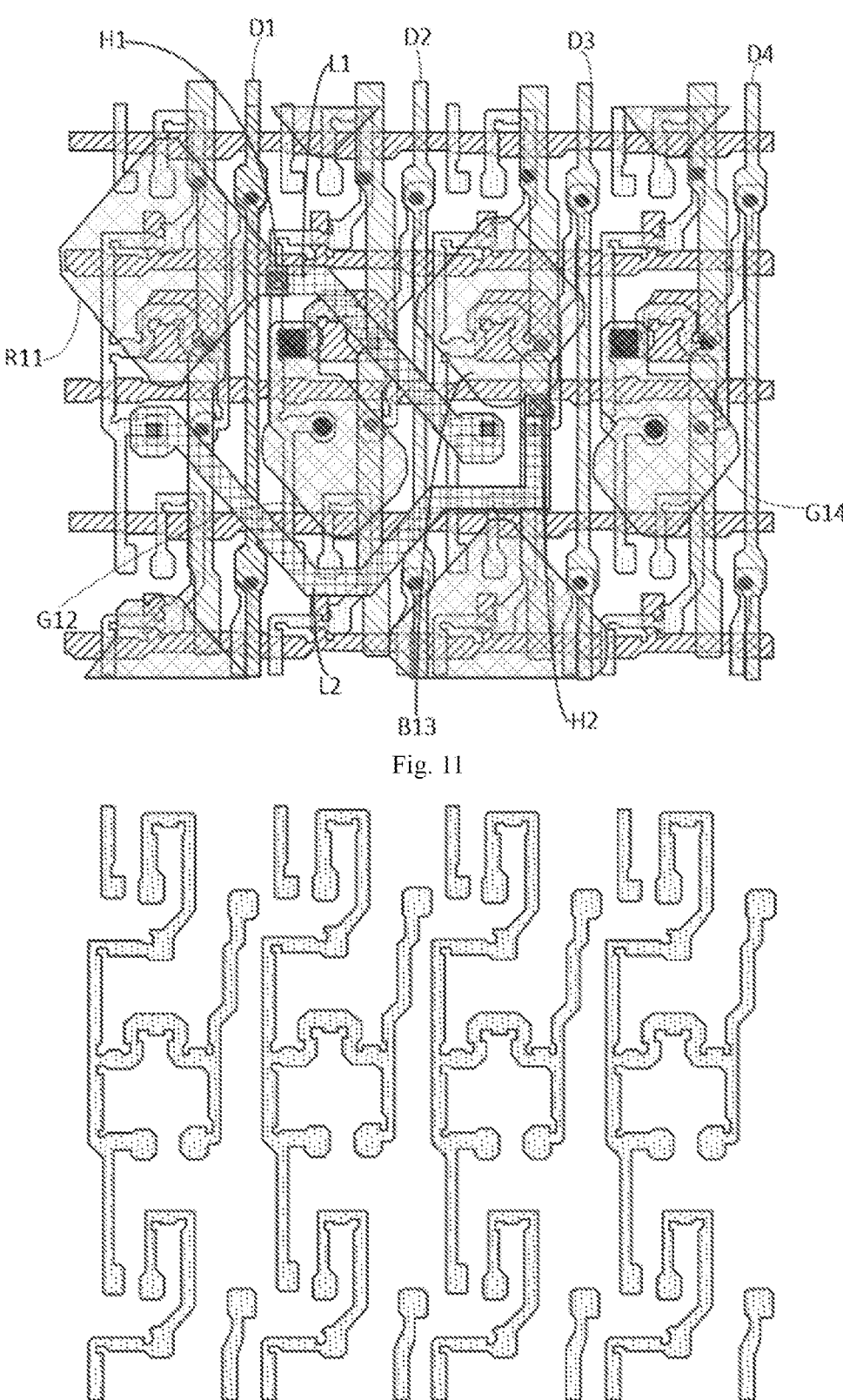
FIG. 11 is a schematic view showing the display substrate in FIG. 10 with the gate metal layer.
FIG. 12 is a schematic view showing the active layer in FIG. 11.

In FIG. 10 and FIG. 11, the first conductive connection portion, the second conductive connection portion, the third conductive connection portion and the fourth conductive connection portion in the first source/drain metal layer are omitted, and each of the conductive connection portions is an adapter portion between a conductive pattern in the anode layer and a corresponding active layer pattern.

In FIG. 10 and FIG. 11, black solid circles and black solid boxes represent via holes.

FIG. 10 shows the display substrate where the active layer, the first source/drain metal layer, the second source/drain metal layer and the anode layer are laminated one on another.

Figures 13, 14:
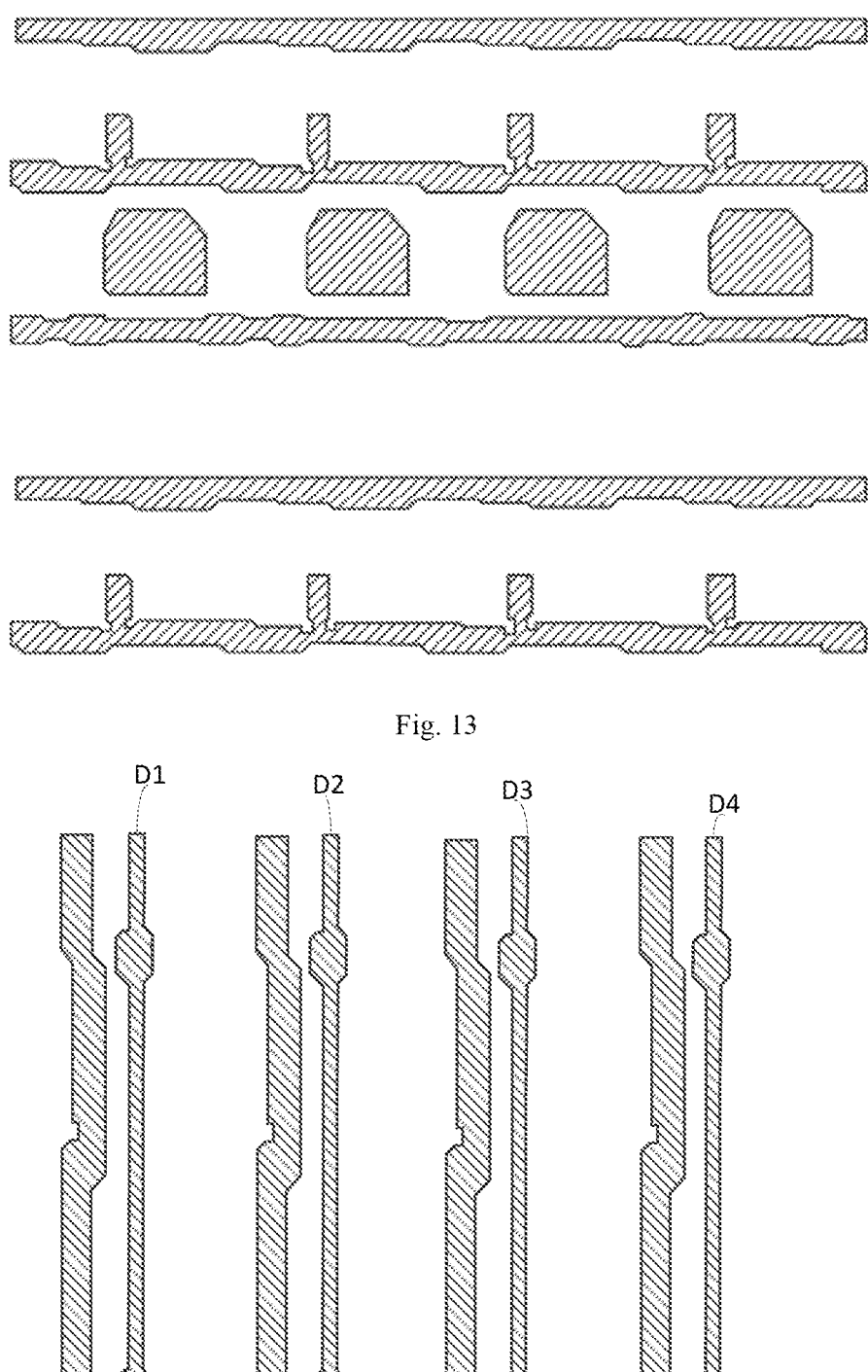
FIG. 13 is a schematic view showing the gate metal layer in FIG. 11.
FIG. 14 is a schematic view showing the first source/drain metal layer in FIG. 11.
Figure 15:
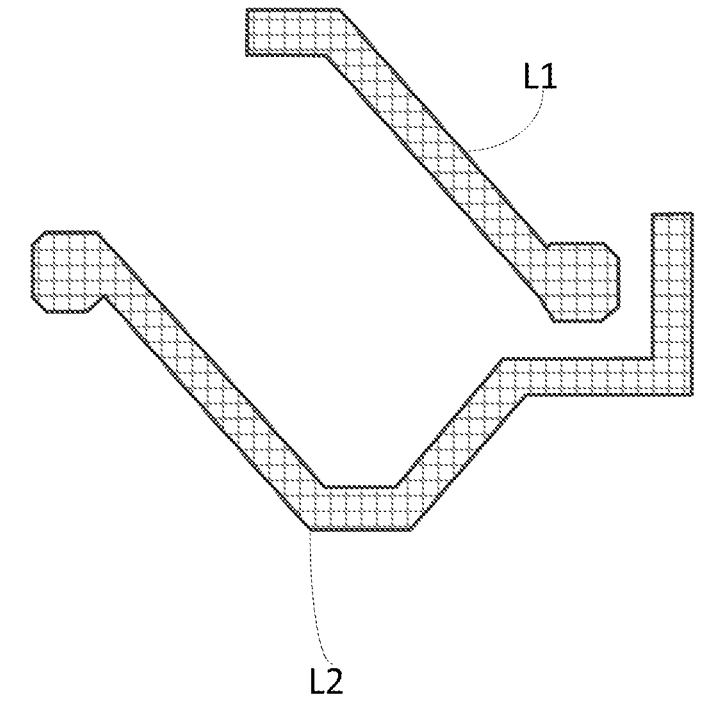
FIG. 15 is a schematic view showing the second source/drain metal layer in FIG. 11.
Figure 16:
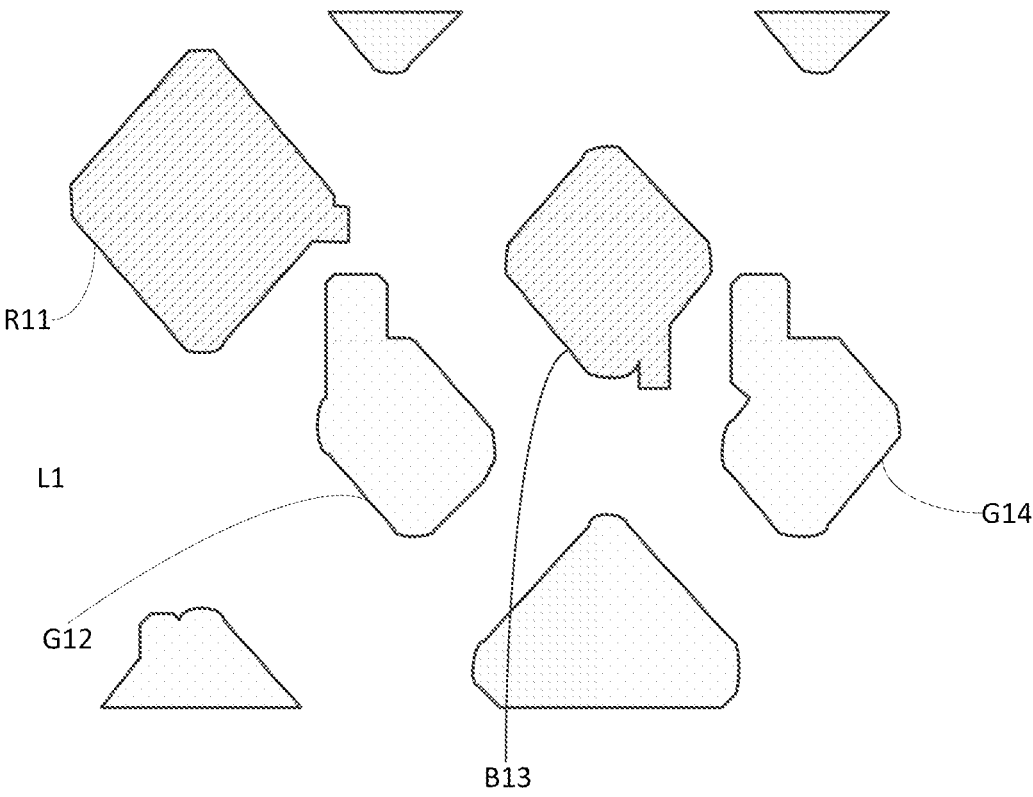
FIG. 16 is a schematic view showing the anode layer in FIG. 11.
Figure 17:
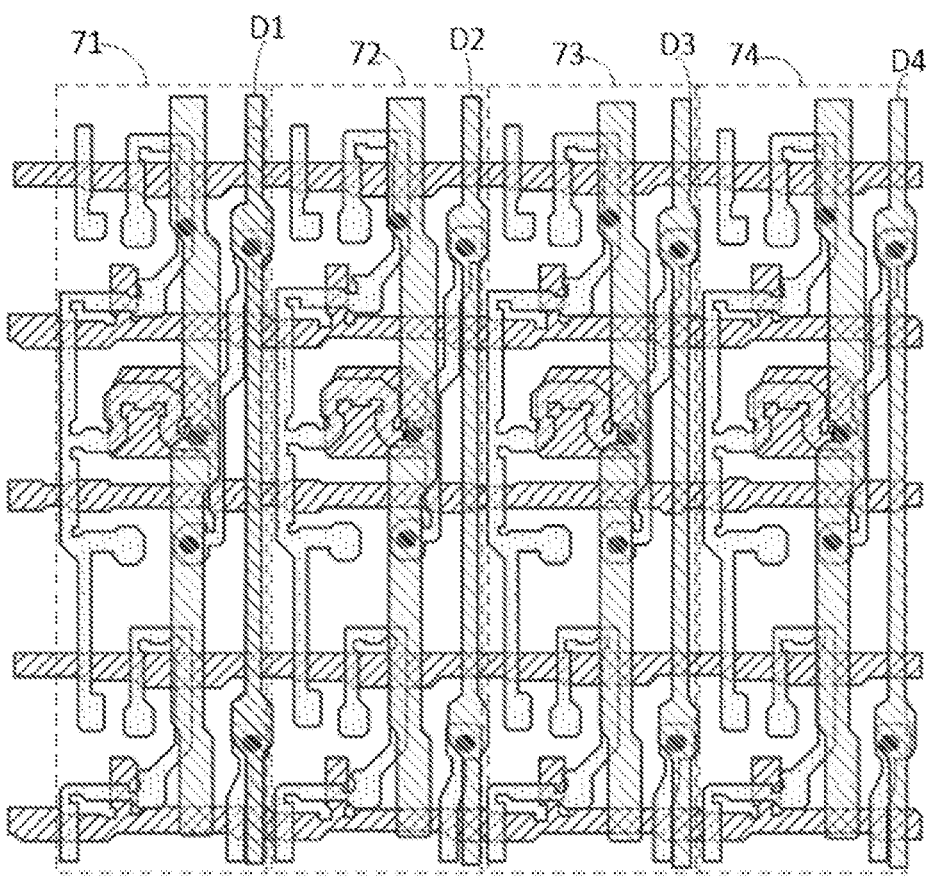
FIG. 17 is a schematic view showing a situation where the active layer, the gate metal layer and the first source/drain metal layer are laminated one on another in FIG. 11.

FIG. 11 shows the display substrate in FIG. 10 with a gate metal layer, FIG. 12 shows the active layer in FIG. 11, FIG. 13 shows the gate metal layer in FIG. 11, FIG. 14 shows the first source/drain metal layer in FIG. 11, FIG. 15 shows the second source/drain metal layer in FIG. 11, FIG. 16 shows the anode layer in FIG. 11, and FIG. 17 shows the display substrate in FIG. 11 where the active layer, the gate metal layer, the first source/drain metal layer and the second source/drain metal layer are laminated one on another. In FIG. 17, 71 represents the pixel driving circuitry in the first row and the first column, 72 represents the pixel driving circuitry in the first row and the second column, 73 represents the pixel driving circuitry in the first row and the third column, and 74 represents the pixel driving circuitry in the first row and the fourth column.

In the embodiments of the present disclosure, the pixel driving circuitries in a $(4n-3)^{th}$ column of the display substrate correspond to a first color, and the pixel driving circuitries in a $(4n-1)^{th}$ column of the display substrate correspond to a second color, where m and n are positive integers. The light-emission element in a $(2m-1)^{th}$ row and a $(4n-3)^{th}$ column of the display substrate is a light-emission element in a second color, and the light-emission element in the $(2m-1)^{th}$ row and the $(4n-1)^{th}$ column of the display substrate is a light-emission element in a first color; the light-emission element in a $(2m)^{th}$ row and the $(4n-3)^{th}$ column of the display substrate is a light-emission element in the first color, and the light-emission element in the $(2m)^{th}$ row and the $(4n-1)^{th}$ column of the display substrate is a light-emission element in the second color; the anode of the light-emission element in the $(2m-1)^{th}$ row and the $(4n-3)^{th}$ column of the display substrate is electrically coupled to the pixel driving circuitry in the $(2m-1)^{th}$ row and the $(4n-1)^{th}$ column of the display substrate: and the anode of the light-emission element arranged in the $(2m-1)^{th}$ row and the $(4n-1)^{th}$ column of the display substrate is electrically coupled to the pixel driving circuitry in the $(2m-1)^{th}$ row and the $(4n-3)^{th}$ column of the display substrate.

In a possible embodiment of the present disclosure, the first color may be, but not limited to, blue, and the second color may be, but not limited to, red. In actual use, the first color may be red, and the second color may be blue.

In a possible embodiment of the present disclosure, the pixel driving circuitries in even-numbered columns of the display substrate correspond to a third color, and the light-emission elements in the even-numbered columns of the display substrate are light-emission element in a third color. The anode of the light-emission element in an $a^{th}$ row and a $(2b)^{th}$ column of the display substrate is electrically coupled to the pixel driving circuitry in the $a^{th}$ row and the $(2b)^{th}$ column of the display substrate, where a and b are positive integers.

In the embodiments of the present disclosure, the third color may be, but not limited to, green.

In the embodiments of the present disclosure, the pixel driving circuitries in the first column of the display substrate correspond to blue, the pixel driving circuitries in the third column of the display substrate correspond to red, and the pixel driving circuitries in the second column and the fourth column of the display substrate correspond to green.

Figure 18:
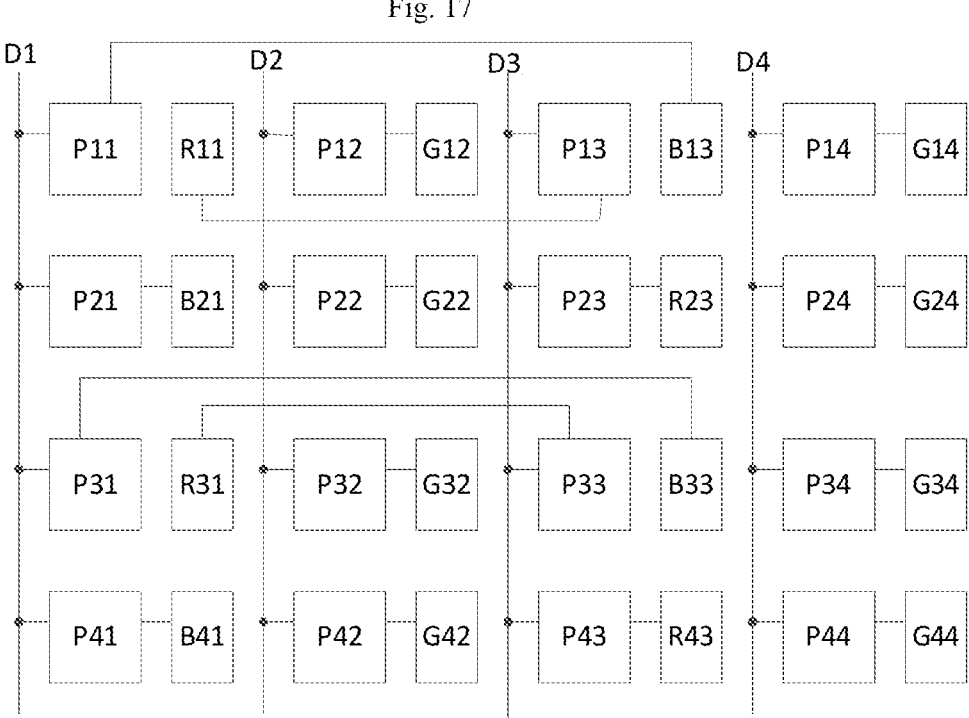
FIG. 18 is a schematic view showing a connection relationship among pixel driving circuitries, light-emission elements and data lines in the display substrate according to one embodiment of the present disclosure.

As shown in FIG. 18, the light-emission element R11 in the first row and the first column of the display substrate is a red light-emission element, and the light-emission element B13 in the first row and the third column of the display substrate is a blue light-emission element; the light-emission element B21 in the second row and the first column of the display substrate is a blue light-emission element, and the light-emission element R23 in the second row and the third column of the display substrate is a red light-emission element; the light-emission element R31 in the third row and the first column of the display substrate is a red light-emission element, and the light-emission element B33 in the third row and the third column of the display substrate is a blue light-emission element; the light-emission element B41 in the fourth row and the first column of the display substrate is a blue light-emission element, and the light-emission element R43 in the fourth row and the third column of the display substrate is a red light-emission element; the light-emission element G12 in the first row and the second column of the display substrate is a green light-emission element, and the light-emission element G14 in the first row and the fourth column of the display substrate is a green light-emission element; the light-emission element G22 in the second row and the second column of the display substrate is a green light-emission element, and the light-emission element G24 in the second row and the fourth column of the display substrate is a green light-emission element; the light-emission element G32 in the third row and the second column of the display substrate is a green light-emission element, and the light-emission element G34 in the third row and the fourth column of the display substrate is a green light-emission element; and the light-emission element G42 in the fourth row and the second column of the display substrate is a green light-emission element, and the light-emission element G44 in the fourth row and the fourth column of the display substrate is a green light-emission element.

As shown in FIG. 18, D1 represents the first data line, D2 represents the second data line, D3 represents the third data line and D4 represents the fourth data line. P11 represents a pixel driving circuitry in the first row and the first column, P12 represents a pixel driving circuitry in the first row and the second column, P13 represents a pixel driving circuitry in the first row and the third column, and P14 represents a pixel driving circuitry in the first row and the fourth column; P21 represents a pixel driving circuitry in the second row and the first column, P22 represents a pixel driving circuitry in the second row and the second column, P23 represents a pixel driving circuitry in the second row and the third column, and P24 represents a pixel driving circuitry in the second row and the fourth column; P31 represents a pixel driving circuitry in the third row and the first column, P32 represents a pixel driving circuitry in the third row and the second column, P33 represents a pixel driving circuitry in the third row and the third column, and P34 represents a pixel driving circuitry in the third row and the fourth column; and P41 represents a pixel driving circuitry in the fourth row and the first column, P42 represents a pixel driving circuitry in the fourth row and the second column, P43 represents a pixel driving circuitry in the fourth row and the third column, and P44 represents a pixel driving circuitry in the fourth row and the fourth column.

As shown in FIG. 18, P11 is electrically coupled to B13 and P13 is electrically coupled to R11; P21 is electrically coupled to B21 and P23 is electrically coupled to R23; P31 is electrically coupled to B33 and P33 is electrically coupled to R31; P41 is electrically coupled to B41 and P43 is electrically coupled to R43; P12 is electrically coupled to G12 and P14 is electrically coupled to G14; P22 is electrically coupled to G22 and P24 is electrically coupled to G24; P32 is electrically coupled to G32 and P34 is electrically coupled to G34; P42 is electrically coupled to G42 and P44 is electrically coupled to G44; P11, P21, P31 and P41 are electrically coupled to D1; P12, P22, P32 and P42 are electrically coupled to D2; P13, P23, P33 and P43 are electrically coupled to D3; and P14, P24, P34 and P44 are electrically coupled to D4.

In the embodiments of the present disclosure, the pixel driving circuitries in a $(4n-3)^{th}$ column of the display substrate correspond to a second color, and the pixel driving circuitries in a $(4n-1)^{th}$ column of the display substrate correspond to a first color, where m and n are positive integers; the light-emission element in a $(2m-1)^{th}$ row and the $(4n-3)^{th}$ column of the display substrate is a light-emission element in the second color, and the light-emission element in the $(2m-1)^{th}$ row and the $(4n-1)^{th}$ column of the display substrate is a light-emission element in the first color; the light-emission element in a $(2m)^{th}$ row and the $(4n-3)^{th}$ column of the display substrate is a light-emission element in the first color, and the light-emission element in the $(2m)^{th}$ row and the $(4n-1)^{th}$ column of the display substrate is a light-emission element in the second color; the anode of the light-emission element in the $(2m)^{th}$ row and the $(4n-3)^{th}$ column of the display substrate is electrically coupled to the pixel driving circuitry in the $(2m)^{th}$ row and the $(4n-1)^{th}$ column of the display substrate; and the anode of the light-emission element in the $(2m)^{th}$ row and the $(4n-1)^{th}$ column of the display substrate is electrically coupled to the pixel driving circuitry in the $(2m)^{th}$ row and the $(4n-3)^{th}$ column of the display substrate.

In the embodiments of the present disclosure, the first color may be, but not limited to, blue, and the second color may be, but not limited to, red. In actual use, the first color may be red, and the second color may be blue.

In the embodiments of the present disclosure, the pixel driving circuitries arranged in the first column of the display substrate correspond to red, the pixel driving circuitries arranged in the third column of the display substrate correspond to blue; and the pixel driving circuitries arranged in the second column and the fourth column of the display substrate correspond to green.

Figure 19:
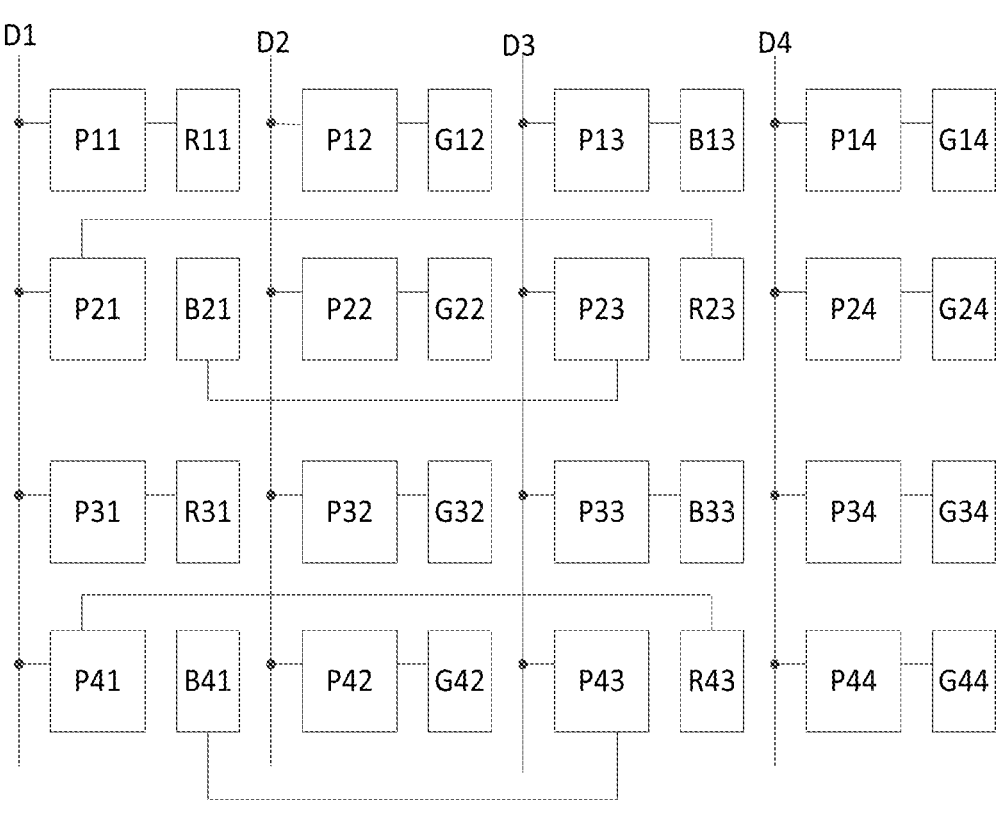
FIG. 19 is another schematic view showing the connection relationship among the pixel driving circuitries, the light-emission elements and the data lines in the display substrate according to one embodiment of the present disclosure.

As shown in FIG. 19, the light-emission element R11 in the first row and the first column of the display substrate is a red light-emission element, and the light-emission element B13 in the first row and the third column of the display substrate is a blue light-emission element; the light-emission element B21 in the second row and the first column of the display substrate is a blue light-emission element, and the light-emission element R23 in the second row and the third column of the display substrate is a red light-emission element; the light-emission element R31 in the third row and the first column of the display substrate is a red light-emission element, and the light-emission element B33 in the third row and the third column of the display substrate is a blue light-emission element; the light-emission element B41 in the fourth row and the first column of the display substrate is a blue light-emission element, and the light-emission element R43 in the fourth row and the third column of the display substrate is a red light-emission element; the light-emission element G12 in the first row and the second column of the display substrate is a green light-emission element, and the light-emission element G14 in the first row and the fourth column of the display substrate is a green light-emission element; the light-emission element G22 in the second row and the second column of the display substrate is a green light-emission element, and the light-emission element G24 in the second row and the fourth column of the display substrate is a green light-emission element; the light-emission element G32 in the third row and the second column of the display substrate is a green light-emission element, and the light-emission element G34 in the third row and the fourth column of the display substrate is a green light-emission element; and the light-emission element G42 in the fourth row and the second column of the display substrate is a green light-emission element, and the light-emission element G44 in the fourth row and the fourth column of the display substrate is a green light-emission element.

As shown in FIG. 19, D1 represents the first data line, D2 represents the second data line, D3 represents the third data line and D4 represents the fourth data line. P11 represents a pixel driving circuitry in the first row and the first column, P12 represents a pixel driving circuitry in the first row and the second column, P13 represents a pixel driving circuitry in the first row and the third column, and P14 represents a pixel driving circuitry in the first row and the fourth column; P21 represents a pixel driving circuitry in the second row and the first column, P22 represents a pixel driving circuitry in the second row and the second column, P23 represents a pixel driving circuitry in the second row and the third column, and P24 represents a pixel driving circuitry in the second row and the fourth column; P31 represents a pixel driving circuitry in the third row and the first column, P32 represents a pixel driving circuitry in the third row and the second column, P33 represents a pixel driving circuitry in the third row and the third column, and P34 represents a pixel driving circuitry in the third row and the fourth column; and P41 represents a pixel driving circuitry in the fourth row and the first column, P42 represents a pixel driving circuitry in the fourth row and the second column, P43 represents a pixel driving circuitry in the fourth row and the third column, and P44 represents a pixel driving circuitry in the fourth row and the fourth column.

As shown in FIG. 19, P11 is electrically coupled to R11 and P13 is electrically coupled to B13; P21 is electrically coupled to R23 and P23 is electrically coupled to B21; P31 is electrically coupled to R31 and P33 is electrically coupled to B33; P41 is electrically coupled to R43 and P43 is electrically coupled to B41; P12 is electrically coupled to G12 and P14 is electrically coupled to G14; P22 is electrically coupled to G22 and P24 is electrically coupled to G24; P32 is electrically coupled to G32 and P34 is electrically coupled to G34; P42 is electrically coupled to G42 and P44 is electrically coupled to G44; P11, P21, P31 and P41 are electrically coupled to D1; P12, P22, P32 and P42 are electrically coupled to D2; P13, P23, P33 and P43 are electrically coupled to D3; and P14, P24, P34 and P44 are electrically coupled to D4.

In the embodiments of the present disclosure, the pixel driving circuitries in a $(4n-2)^{th}$ column of the display substrate correspond to a first color, and the pixel driving circuitries in a $(4n)^{th}$ column of the display substrate correspond to a second color, where m and n are positive integers; the light-emission element in a $(2m-1)^{th}$ row and the $(4n-$ $2)^{th}$ column of the display substrate is a light-emission element in the second color, and the light-emission element in the $(2m-1)^{th}$ row and the $(4n)^{th}$ column of the display substrate is a light-emission element in the first color; the light-emission element in a $(2m)^{th}$ row and the $(4n-2)^{th}$ column of the display substrate is a light-emission element in the first color, and the light-emission element in the $(2m)^{th}$ row and the $(4n)^{th}$ column of the display substrate is a light-emission element in the second color; the anode of the light-emission element in the $(2m-1)^{th}$ row and the $(4n-2)^{th}$ column of the display substrate is electrically coupled to the pixel driving circuitry in the $(2m-1)^{th}$ row and the $(4n)^{th}$ column of the display substrate; and the anode of the light-emission element in the $(2m-1)^{th}$ row and the $(4n)^{th}$ column of the display substrate is electrically coupled to the pixel driving circuitry in the $(2m-1)^{th}$ row and the $(4n-2)^{th}$ column of the display substrate.

In a possible embodiment of the present disclosure, the first color may be, but not limited to, blue, and the second color may be, but not limited to, red. In actual use, the first color may be red, and the second color may be blue.

In a possible embodiment of the present disclosure, the pixel driving circuitries in odd-numbered columns of the display substrate correspond to a third color, and the light-emission elements in the odd-numbered columns of the display substrate are light-emission elements in a third color. The anode of the light-emission element in an $a^{th}$ row and a $(2b-1)^{th}$ column of the display substrate are electrically coupled to the pixel driving circuitry in the $a^{th}$ row and the $(2b-1)^{th}$ column of the display substrate, where a and b are positive integers.

In the embodiments of the present disclosure, the third color may be, but not limited to, green.

In the embodiments of the present disclosure, the pixel driving circuitries in the second column of the display substrate correspond to blue, the pixel driving circuitries in the fourth column of the display substrate correspond to red, and the pixel driving circuitries in the first column and the third column of the display substrate correspond to green.

Figure 20:
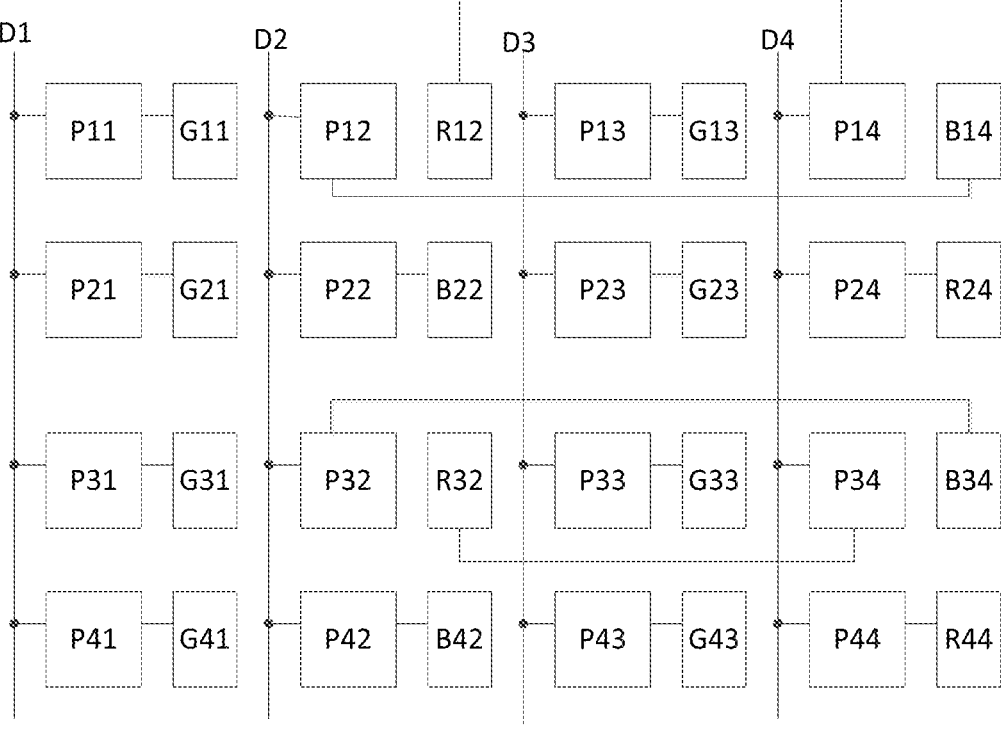
FIG. 20 is yet another schematic view showing the connection relationship among the pixel driving circuitries, the light-emission elements and the data lines in the display substrate according to one embodiment of the present disclosure.

As shown in FIG. 20, the light-emission element R12 in the first row and the second column of the display substrate is a red light-emission element, and the light-emission element B14 in the first row and the fourth column of the display substrate is a blue light-emission element; the light-emission element B22 in the second row and the second column of the display substrate is a blue light-emission element, and the light-emission element R24 in the second row and the fourth column of the display substrate is a red light-emission element; the light-emission element R32 in the third row and the second column of the display substrate is a red light-emission element, and the light-emission element B34 in the third row and the fourth column of the display substrate is a blue light-emission element; the light-emission element B42 in the fourth row and the second columns of the display substrate is a blue light-emission element, and the light-emission element R44 in the fourth row and the fourth column of the display substrate is a red light-emission element; the light-emission element G11 in the first row and the first column of the display substrate is a green light-emission element, and the light-emission element G13 in the first row and the third column of the display substrate is a green light-emission element; the light-emission element G21 in the second row and the first column of the display substrate is a green light-emission element, and the light-emission element G23 in the second row and the third column of the display substrate is a green light-emission element; the light-emission element G31 in the third row and the first column of the display substrate is a green light-emission element, and the light-emission element G33 in the third row and the third column of the display substrate is a green light-emission element; and the light-emission element G41 in the fourth row and the first column of the display substrate is a green light-emission element, and the light-emission element G43 in the fourth row and the third column of the display substrate is a green light-emission element.

In FIG. 20, D1 represents the first data line, D2 represents the second data line, D3 represents the third data line and D4 represents the fourth data line. P11 represents a pixel driving circuitry in the first row and the first column, P12 represents a pixel driving circuitry in the first row and the second column, P13 represents a pixel driving circuitry in the first row and the third column, and P14 represents a pixel driving circuitry in the first row and the fourth column; P21 represents a pixel driving circuitry in the second row and the first column, P22 represents a pixel driving circuitry in the second row and the second column, P23 represents a pixel driving circuitry in the second row and the third column, and P24 represents a pixel driving circuitry in the second row and the fourth column; P31 represents a pixel driving circuitry in the third row and the first column, P32 represents a pixel driving circuitry in the third row and the second column, P33 represents a pixel driving circuitry in the third row and the third column, and P34 represents a pixel driving circuitry in the third row and the fourth column; and P41 represents a pixel driving circuitry in the fourth row and the first column, P42 represents a pixel driving circuitry in the fourth row and the second column, P43 represents a pixel driving circuitry in the fourth row and the third column, and P44 represents a pixel driving circuitry in the fourth row and the fourth column.

As shown in FIG. 20, the anode of the light-emission element R12 in the first row and the second column of the display substrate is electrically coupled to the pixel driving circuitry P14 in the first row and the fourth column of the display substrate; the anode of the light-emission element B14 in the first row and the fourth column of the display substrate is electrically coupled to the pixel driving circuitry P12 in the first row and the second column of the display substrate; the anode of the light-emission element R32 in the third row and the second column of the display substrate is electrically coupled to the pixel driving circuitry P34 in the third row and the fourth column of the display substrate; the anode of the light-emission element B34 in the third row and the fourth column of the display substrate is electrically coupled to the pixel driving circuitry P32 in the third row and the second column of the display substrate; the anode of the light-emission element B22 in the second row and the second column of the display substrate is electrically coupled to the pixel driving circuitry P22 in the second row and the second column of the display substrate; the anode of the light-emission element R24 in the second row and the fourth column of the display substrate is electrically coupled to the pixel driving circuitry P24 in the second row and the fourth column of the display substrate; the anode of the light-emission element B42 in the fourth row and the second column of the display substrate is electrically coupled to the pixel driving circuitry P42 in the fourth row and the second column of the display substrate; the anode of the light-emission element R44 in the fourth row and the fourth column of the display substrate is electrically coupled to the pixel driving circuitry P44 in the fourth row and the fourth column of the display substrate; the anode of the light-emission element G11 in the first row and the first column of the display substrate is electrically coupled to the pixel driving circuitry P11 in the first row and the first column of the display substrate: the anode of the light-emission element G13 in the first row and the third column of the display substrate is electrically coupled to the pixel driving circuitry P13 in the first row and the third column of the display substrate; the anode of the light-emission element G21 in the second row and the first column of the display substrate is electrically coupled to the pixel driving circuitry P21 in the second row and the first column of the display substrate; the anode of the light-emission element G23 in the second row and the third column of the display substrate is electrically coupled to the pixel driving circuitry P23 in the second row and the third column of the display substrate; the anode of the light-emission element G31 in the third row and the first column of the display substrate is electrically coupled to the pixel driving circuitry P31 in the third row and the first column of the display substrate; the anode of the light-emission element G33 in the third row and the third column of the display substrate is electrically coupled to the pixel driving circuitry P33 in the third row and the third column of the display substrate; the anode of the light-emission element G41 in the fourth row and the first column of the display substrate is electrically coupled to the pixel driving circuitry P41 in the fourth row and the first column of the display substrate; the anode of the light-emission element G43 in the fourth row and the third column of the display substrate is electrically coupled to the pixel driving circuitry P43 in the fourth row and the third column of the display substrate; P11, P21, P31 and P41 are electrically coupled to D1; P12, P22, P32 and P42 are electrically coupled to D2; P13, P23, P33 and P43 are electrically coupled to D3; and P14, P24, P34 and P44 are electrically coupled to D4.

In the embodiments of the present disclosure, the pixel driving circuitries in a $(4n-2)^{th}$ column of the display substrate correspond to a second color, and the pixel driving circuitries in a $(4n)^{th}$ column of the display substrate correspond to a first color, where m and n are positive integers; the light-emission element in a $(2m-1)^{th}$ row and the $(4n-2)^{th}$ column of the display substrate is a light-emission element in the second color, and the light-emission element in the $(2m-1)^{th}$ row and the $(4n)^{th}$ column of the display substrate is a light-emission element in the first color; the light-emission element in a $(2m)^{th}$ row and the $(4n-2)^{th}$ column of the display substrate is a light-emission element in the first color, and the light-emission element in the $(2m)^{th}$ row and the $(4n)^{th}$ column of the display substrate is a light-emission element in the second color; the anode of the light-emission element in the $(2m)^{th}$ row and the $(4n-2)^{th}$ column of the display substrate is electrically coupled to the pixel driving circuitry in the $(2m)^{th}$ row and the $(4n)^{th}$ column of the display substrate; and the anode of the light-emission element in the $(2m)^{th}$ row and the $(4n)^{th}$ column of the display substrate is electrically coupled to the pixel driving circuitry in the $(2m)^{th}$ row and the $(4n-2)^{th}$ column of the display substrate.

In the embodiments of the present disclosure, the pixel driving circuitries in the second column of the display substrate correspond to red, the pixel driving circuitries in the fourth column of the display substrate correspond to blue; and the pixel driving circuitries in the first column and the third column of the display substrate correspond to green.

Figure 21:
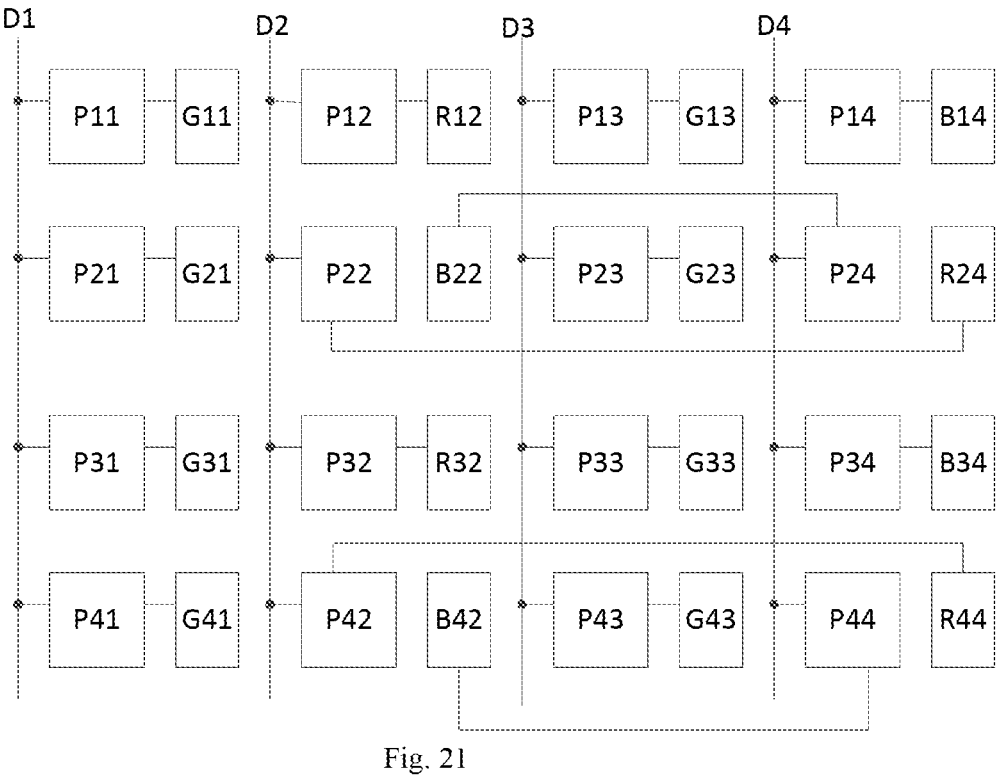
FIG. 21 is still yet another schematic view showing the connection relationship among the pixel driving circuitries, the light-emission elements and the data lines in the display substrate according to one embodiment of the present disclosure.

As shown in FIG. 21, the light-emission element R12 in the first row and the second column of the display substrate is a red light-emission element, and the light-emission element B14 in the first row and the fourth column of the display substrate is a blue light-emission element; the light-emission element B22 in the second row and the second column of the display substrate is a blue light-emission element, and the light-emission element R24 in the second row and the fourth column of the display substrate is a red light-emission element; the light-emission element R32 in the third row and the second column of the display substrate is a red light-emission element, and the light-emission element B34 in the third row and the fourth column of the display substrate is a blue light-emission element; the light-emission element B42 in the fourth row and the second column of the display substrate is a blue light-emission element, and the light-emission element R44 in the fourth row and the fourth column of the display substrate is a red light-emission element; the light-emission element G11 in the first row and the first column of the display substrate is a green light-emission element, and the light-emission element G13 in the first row and the third column of the display substrate is a green light-emission element; the light-emission element G21 in the second row and the first column of the display substrate is a green light-emission element, and the light-emission element G23 in the second row and the third column of the display substrate is a green light-emission element; the light-emission element G31 in the third row and the first column of the display substrate is a green light-emission element, and the light-emission element G33 in the third row and the third column of the display substrate is a green light-emission element; and the light-emission element G41 in the fourth row and the first column of the display substrate is a green light-emission element, and the light-emission element G43 in the fourth row and the third column of the display substrate is a green light-emission element.

In FIG. 21, D1 represents the first data line, D2 represents the second data line, D3 represents the third data line and D4 represents the fourth data line. P11 represents a pixel driving circuitry in the first row and the first column. P12 represents a pixel driving circuitry in the first row and the second column, P13 represents a pixel driving circuitry in the first row and the third column, and P14 represents a pixel driving circuitry in the first row and the fourth column; P21 represents a pixel driving circuitry in the second row and the first column, P22 represents a pixel driving circuitry in the second row and the second column, P23 represents a pixel driving circuitry in the second row and the third column, and P24 represents a pixel driving circuitry in the second row and the fourth column; P31 represents a pixel driving circuitry in the third row and the first column, P32 represents a pixel driving circuitry in the third row and the second column, P33 represents a pixel driving circuitry in the third row and the third column, and P34 represents a pixel driving circuitry in the third row and the fourth column; and P41 represents a pixel driving circuitry in the fourth row and the first column, P42 represents a pixel driving circuitry in the fourth row and the second column, P43 represents a pixel driving circuitry in the fourth row and the third column, and P44 represents a pixel driving circuitry in the fourth row and the fourth column.

As shown in FIG. 21, the anode of the light-emission element B22 in the second row and the second column of the display substrate is electrically coupled to the pixel driving circuitry P24 in the second row and the fourth column of the display substrate; the anode of the light-emission element R24 in the second row and the fourth column of the display substrate is electrically coupled to the pixel driving circuitry P22 in the second row and the second column of the display substrate; the anode of the light-emission element B42 in the fourth row and the second column of the display substrate is electrically coupled to the pixel driving circuitry P44 in the fourth row and the fourth column of the display substrate; the anode of the light-emission element R44 in the fourth row and the fourth column of the display substrate is electrically coupled to the pixel driving circuitry P42 in the fourth row and the second column of the display substrate; the anode of the light-emission element R12 in the first row and the second column of the display substrate is electrically coupled to the pixel driving circuitry P12 in the first row and the second column of the display substrate; the anode of the light-emission element B14 in the first row and the fourth column of the display substrate is electrically coupled to the pixel driving circuitry P14 in the first row and the fourth column of the display substrate; the anode of the light-emission element R32 in the third row and the second column of the display substrate is electrically coupled to the pixel driving circuitry P32 in the third row and the second column of the display substrate; the anode of the light-emission element B34 in the third row and the fourth column of the display substrate is electrically coupled to the pixel driving circuitry P34 in the third row and the fourth column of the display substrate; the anode of the light-emission element G11 in the first row and the first column of the display substrate is electrically coupled to the pixel driving circuitry P11 in the first row and the first column of the display substrate; the anode of the light-emission element G13 in the first row and the third columns of the display substrate is electrically coupled to the pixel driving circuitry P13 in the first row and the third column of the display substrate; the anode of the light-emission element G21 in the second row and the first column of the display substrate is electrically coupled to the pixel driving circuitry P21 in the second row and the first column of the display substrate; the anode of the light-emission element G23 in the second row and the third column of the display substrate is electrically coupled to the pixel driving circuitry P23 in the second row and the third column of the display substrate; the anode of the light-emission element G31 in the third row and the first column of the display substrate is electrically coupled to the pixel driving circuitry P31 in the third row and the first column of the display substrate; the anode of the light-emission element G33 in the third row and the third column of the display substrate is electrically coupled to the pixel driving circuitry P33 in the third row and the third column of the display substrate: the anode of the light-emission element G41 in the fourth row and the first column of the display substrate is electrically coupled to the pixel driving circuitry P41 in the fourth row and the first column of the display substrate; the anode of the light-emission element G43 in the fourth row and the third column of the display substrate is electrically coupled to the pixel driving circuitry P43 in the fourth row and the third column of the display substrate; P11, P21, P31 and P41 are electrically coupled to D1; P12, P22, P32 and P42 are electrically coupled to D2; P13, P23, P33 and P43 are electrically coupled to D3; and P14, P24, P34 and P44 are electrically coupled to D4.

The present disclosure further provides in some embodiments a display device, which includes the above-mentioned display substrate.

The display device may be any product or member having a display function, such as a mobile phone, a tablet computer, a television, a monitor, a laptop computer, a digital photo frame, or a navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a plurality of data lines, a plurality of pixel driving circuitries arranged in rows and columns and a plurality of light-emission elements arranged in rows and columns on the base substrate, wherein each light-emission element comprises an anode and corresponds to a respective color;

the pixel driving circuitries in a same column are electrically coupled to a same data line, the same data line is configured to provide a data voltage corresponding to a same color, and the pixel driving circuitries in the same column electrically coupled to the same data line correspond to the same color; and the anode of the each light-emission element is electrically coupled to a corresponding pixel driving circuitry, and the corresponding pixel driving circuitry is configured to provide a driving signal to the each light-emission element electrically coupled to the corresponding pixel driving circuitry to drive the each light-emission element to emit light in a color corresponding to the corresponding pixel driving circuitry;

wherein the pixel driving circuitries in a (4n−3)th column of the display substrate correspond to a first color, and the pixel driving circuitries in a (4n−1)th column of the display substrate correspond to a second color;

the light-emission element in a (2m−1)th row and a (4n−3)th column of the display substrate is a light-emission element in a second color, and the light-emission element in the (2m−1)th row and the (4n−1)th column of the display substrate is a light-emission element in a first color;

the light-emission element in a (2m)th row and the (4n−3)th column of the display substrate is a light-emission element in the first color, and the light-emission element in the (2m)th row and the (4n−1)th column of the display substrate is a light-emission element in the second color;

the anode of the light-emission element in the (2m−1)th row and the (4n−3)th column of the display substrate is electrically coupled to the pixel driving circuitry in the (2m−1)th row and the (4n−1)th column of the display substrate; and the anode of the light-emission element arranged in the (2m−1)th row and the (4n−1)th column of the display substrate is electrically coupled to the pixel driving circuitry in the (2m−1)th row and the (4n−3)th column of the display substrate;

or, wherein the pixel driving circuitries in a (4n−3)th column of the display substrate correspond to a second color, and the pixel driving circuitries in a (4n−1)th column of the display substrate correspond to a first color;

the light-emission element in a (2m−1)th row and the (4n−3)th column of the display substrate is a light-emission element in the second color, and the light-emission element in the (2m−1)th row and the (4n−1)th column of the display substrate is a light-emission element in the first color;

the light-emission element in a (2m)th row and the (4n−3)th column of the display substrate is a light-emission element in the first color, and the light-emission element in the (2m)th row and the (4n−1)th column of the display substrate is a light-emission element in the second color;

the anode of the light-emission element in the (2m)th row and the (4n−3)th column of the display substrate is electrically coupled to the pixel driving circuitry in the (2m)th row and the (4n−1)th column of the display substrate; and the anode of the light-emission element in the (2m)th row and the (4n−1)th column of the display substrate is electrically coupled to the pixel driving circuitry in the (2m)th row and the (4n−3)th column of the display substrate;

or, wherein the pixel driving circuitries in a (4n−2)th column of the display substrate correspond to a first color, and the pixel driving circuitries in a (4n)th column of the display substrate correspond to a second color;

the light-emission element in a (2m−1)th row and the (4n−2)th column of the display substrate is a light-emission element in the second color, and the light-emission element in the (2m−1)th row and the (4n)th column of the display substrate is a light-emission element in the first color;

the light-emission element in a (2m)th row and the (4n−2)th column of the display substrate is a light-emission element in the first color, and the light-emission element in the (2m)th row and the (4n)th column of the display substrate is a light-emission element in the second color;

the anode of the light-emission element in the (2m−1)th row and the (4n−2)th column of the display substrate is electrically coupled to the pixel driving circuitry in the (2m−1)th row and the (4n)th column of the display substrate; and the anode of the light-emission element in the (2m−1)th row and the (4n)th column of the display substrate is electrically coupled to the pixel driving circuitry in the (2m−1)th row and the (4n−2)th column of the display substrate;

or, wherein the pixel driving circuitries in a (4n−2)th column of the display substrate correspond to a second color, and the pixel driving circuitries in a (4n)th column of the display substrate correspond to a first color;

the light-emission element in a (2m−1)th row and the (4n−2)th column of the display substrate is a light-emission element in the second color, and the light-emission element in the (2m−1)th row and the (4n)th column of the display substrate is a light-emission element in the first color;

the light-emission element in a (2m)th row and the (4n−2)th column of the display substrate is a light-emission element in the first color, and the light-emission element in the (2m)th row and the (4n)th column of the display substrate is a light-emission element in the second color;

the anode of the light-emission element in the (2m)th row and the (4n−2)th column of the display substrate is electrically coupled to the pixel driving circuitry in the (2m)th row and the (4n)th column of the display substrate; and the anode of the light-emission element in the (2m)th row and the (4n)th column of the display substrate is electrically coupled to the pixel driving circuitry in the (2m)th row and the (4n−2)th column of the display substrate; and wherein, m and n are positive integers.

2. The display substrate according to claim 1, wherein the anode of the each light-emission element is arranged in a same row as the corresponding pixel driving circuitry electrically coupled to the each light-emission element.

3. The display substrate according to claim 2, wherein the corresponding pixel driving circuitry is arranged closest to the anode of the each light-emission element and corresponds to a same color as the each light-emission element.

4. The display substrate according to claim 1, wherein the anodes of at least a part of the plurality of light-emission elements are electrically coupled to the corresponding pixel driving circuitries through connection lines.

5. The display substrate according to claim 4, wherein the display substrate comprises a first source/drain metal layer, a second source/drain metal layer and an anode layer laminated one on another in a direction away from the base substrate, the plurality of data lines is arranged in the first source/drain metal layer, the anodes are arranged in the anode layer, and the connection lines are arranged in the second source/drain metal layer or the anode layer.

6. The display substrate according to claim 1, wherein in a case that the pixel driving circuitries in the (4n−3)th column of the display substrate correspond to the first color, and the pixel driving circuitries in the (4n−1)th column of the display substrate correspond to the second color;

the pixel driving circuitries in even-numbered columns of the display substrate correspond to a third color, and the light-emission elements in the even-numbered columns of the display substrate are light-emission elements in the third color; and the anode of the light-emission element in an $a^{th}$ row and a $(2b)^{th}$ column of the display substrate is electrically coupled to the pixel driving circuitry in the $a^{th}$ row and the $(2b)^{th}$ column of the display substrate, where a and b are positive integers.

7. The display substrate according to claim 1, wherein in a case that the pixel driving circuitries in the (4n−2)th column of the display substrate correspond to the first color, and the pixel driving circuitries in the (4n)th column of the display substrate correspond to the second color;

the pixel driving circuitries in odd-numbered columns of the display substrate correspond to a third color, and the light-emission elements in the odd-numbered columns of the display substrate are light-emission elements in the third color; and the anode of the light-emission element in an $a^{th}$ row and a $(2b−1)^{th}$ column of the display substrate is electrically coupled to the pixel driving circuitry in the $a^{th}$ row and the $(2b−1)^{th}$ column of the display substrate, where a and b are positive integers.

8. A display device, comprising the display substrate according to claim 1.

9. The display device according to claim 8, wherein the anode of the each light-emission element is arranged in a same row as the corresponding pixel driving circuitry electrically coupled to the each light-emission element.

10. The display device according to claim 9, wherein the corresponding pixel driving circuitry is arranged closest to the anode of the each light-emission element and corresponds to a same color as the each light-emission element.

11. The display device according to claim 8, wherein the anodes of at least a part of the plurality of light-emission elements are electrically coupled to corresponding pixel driving circuitries through connection lines.

12. The display device according to claim 11, wherein the display substrate comprises a first source/drain metal layer, a second source/drain metal layer and an anode layer laminated one on another in a direction away from the base substrate, the plurality of data lines is arranged in the first source/drain metal layer, the anodes are arranged in the anode layer, and the connection lines are arranged in the second source/drain metal layer or the anode layer.

13. The display substrate according to claim 1, wherein in a case that the pixel driving circuitries in the (4n−3)th column of the display substrate correspond to the second color, and the pixel driving circuitries in the (4n−1)th column of the display substrate correspond to the first color;

the pixel driving circuitries in even-numbered columns of the display substrate correspond to a third color, and the light-emission elements in the even-numbered columns of the display substrate are light-emission elements in the third color; and the anode of the light-emission element in an $a^{th}$ row and a $(2b)^{th}$ column of the display substrate is electrically coupled to the pixel driving circuitry in the $a^{th}$ row and the $(2b)^{th}$ column of the display substrate, where a and b are positive integers.

14. The display substrate according to claim 1, wherein in a case that the pixel driving circuitries in the (4n−2)th column of the display substrate correspond to the second color, and the pixel driving circuitries in the (4n)th column of the display substrate correspond to the first color;

the pixel driving circuitries in odd-numbered columns of the display substrate correspond to a third color, and the light-emission elements in the odd-numbered columns of the display substrate are light-emission elements in the third color; and the anode of the light-emission element in an $a^{th}$ row and a $(2b−1)^{th}$ column of the display substrate is electrically coupled to the pixel driving circuitry in the $a^{th}$ row and the $(2b−1)^{th}$ column of the display substrate, where a and b are positive integers.

* * * * *